(12) United States Patent
Dai et al.

(10) Patent No.: US 9,831,385 B2
(45) Date of Patent: Nov. 28, 2017

(54) SEMICONDUCTOR LIGHT-EMITTING DEVICES

(71) Applicant: HUGA OPTOTECH INC., Taichung (TW)

(72) Inventors: Jing Jie Dai, Taichung (TW); Yen Chieh Huang, Taichung (TW); Shu Ying Yang, Taichung (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 13/933,102

(22) Filed: Jul. 1, 2013

(65) Prior Publication Data

US 2013/0313597 A1 Nov. 28, 2013

Related U.S. Application Data

(63) Continuation of application No. 12/652,977, filed on Jan. 6, 2010, now Pat. No. 8,476,658.

(60) Provisional application No. 61/232,553, filed on Nov. 25, 2009.

(51) Int. Cl.
*H01L 33/22* (2010.01)
*H01L 33/20* (2010.01)

(52) U.S. Cl.
CPC .............. *H01L 33/22* (2013.01); *H01L 33/20* (2013.01); *H01L 2933/0083* (2013.01)

(58) Field of Classification Search
CPC .. H01L 33/20; H01L 33/22; H01L 2933/0083
USPC .......................................................... 257/98
See application file for complete search history.

(56) References Cited

U.S. PATENT DOCUMENTS

| 7,053,420 | B2 * | 5/2006 | Tadatomo | H01L 33/22 |
| | | | | 257/103 |
| 7,683,386 | B2 * | 3/2010 | Tanaka et al. | 257/88 |
| 2004/0113166 | A1 | 6/2004 | Tadatomo et al. | |
| 2008/0303042 | A1 * | 12/2008 | Minato et al. | 257/98 |
| 2010/0102353 | A1 * | 4/2010 | Park | 257/98 |

FOREIGN PATENT DOCUMENTS

JP 2008131000 A 6/2008

* cited by examiner

*Primary Examiner* — Laura Menz
*Assistant Examiner* — Candice Y Chan
(74) *Attorney, Agent, or Firm* — Patterson + Sheridan, LLP

(57) ABSTRACT

A semiconductor light-emitting device includes a substrate having an upper surface and a plurality of bumps positioned on the upper surface in a periodic manner, a first conductive type semiconductor layer positioned on the substrate, a light-emitting structure positioned on the first conductive type semiconductor layer, and a second conductive type semiconductor layer positioned on the light-emitting structure. The first conductive type semiconductor layer includes a plurality of protrusions each facing a portion of the substrate between the bumps, the protrusions are positioned in a ring manner at a peripheral region of the first conductive type semiconductor layer, and the protrusions are spaced apart from the bumps.

12 Claims, 24 Drawing Sheets

SEMICONDUCTOR LIGHT-EMITTING DEVICES

BACKGROUND OF THE INVENTION (A) Field of the Invention

The present disclosure relates to a semiconductor light-emitting device, and more particularly, to a semiconductor light-emitting device with improved light-extraction efficiency.

(B) Description of the Related Art

Semiconductor light-emitting devices such as light-emitting diodes (LED) are widely used in traffic lights, vehicle electronics, LCD backing lights, and general illumination. In the light-emitting diode an n-type semiconductor layer, a light-emitting region and a p-type semiconductor layer are essentially made to grow on a substrate to form a layered structure, and the electrodes are formed on the p-type semiconductor layer and on the n-type semiconductor layer. Light is generated through the recombination of holes and electrons that have been injected through the semiconductor layers to the light-emitting region, and then emitted through a light transmitting electrode on the p-type semiconductor layer or from the substrate. The material used for preparing the visible light-emitting diode includes the III-V compound such as AlGaInP for green, yellow, orange or red light-emitting diodes, and GaN for blue or ultraviolet light-emitting diodes, wherein the GaN light-emitting diode is formed on the sapphire substrate.

Extracting the light beams generated by the light-emitting layer to the outside of the light-emitting device is one important aspect to be improved in the semiconductor light-emitting device. Researchers use a transparent electrode in the conventional light-emitting device to prevent the upward light beams generated by the light-emitting layer from being blocked on the propagation path to the outside of the light-emitting device, or use a reflection layer to reflect the downward light beams generated by the light-emitting layer back to the top of the light-emitting device. However, in addition to the upward light beams and downward light beams, the light-emitting layer also emits light beams in other directions, and a portion of the light beams are reflected internally into the light-emitting device due to the total reflection effect. Consequently, the light beams may be adsorbed by the light-emitting layer, rather than propagating to the outside of the light-emitting device.

TW 561632 discloses a semiconductor light-emitting device having at least one recess and/or protruding portion on the surface portion of a substrate. The recess and/or protruding portion has a shape that prevents crystal defects from occurring in semiconductor layers. In addition, TW 536841 discloses a semiconductor light-emitting element having an undulation formed on the surface of a first layer (substrate), and a second layer having a refractory index different from that of the first layer grown to fill the undulation. Furthermore, a first crystal may be grown in an undulated shape on a crystal layer, which is the foundation of crystal growth. After such undulated refractory interface is formed, a semiconductor crystal layer having a refractory index different from that of the first layer is laminated thereon.

SUMMARY OF THE INVENTION

One aspect of the present disclosure provides a semiconductor light-emitting device with improved light-extraction efficiency by forming bumps on a substrate and a first conductive type semiconductor layer having a plurality of protrusions each spaced apart from the bumps and facing a portion of the substrate between the bumps and positioned in a ring manner at a peripheral region of the first conductive type semiconductor layer.

A semiconductor light-emitting device according to this aspect of the present disclosure comprises a substrate including an upper surface and a plurality of bumps positioned on the upper surface in a periodic manner, a first conductive type semiconductor layer positioned on the substrate, a light-emitting structure positioned on the first conductive type semiconductor layer, and a second conductive type semiconductor layer positioned on the light-emitting structure. The first conductive type semiconductor layer includes a plurality of protrusions each facing a portion of the substrate between the bumps, the protrusions are positioned in a ring manner at a peripheral region of the first conductive type semiconductor layer, and the protrusions are spaced apart from the bumps.

The foregoing has outlined rather broadly the features and technical advantages of the present disclosure in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the invention as set forth in the appended claims.

BRIEF DESCRIPTION OF THE DRAWINGS

The objectives and advantages of the present disclosure will become apparent upon reading the following description and upon reference to the accompanying drawings in which.

DETAILED DESCRIPTION OF THE INVENTION

Figure 1:
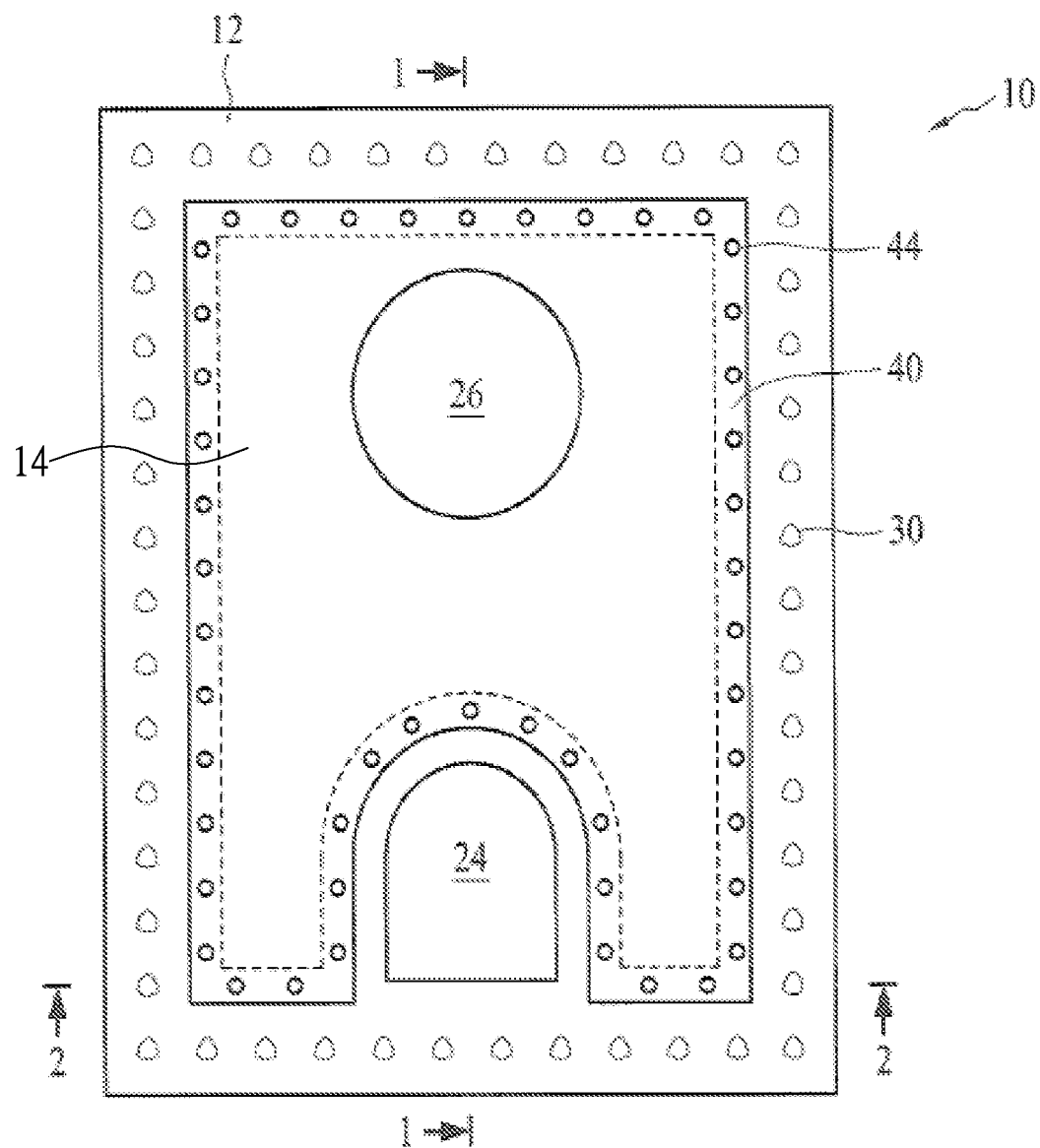
FIG. 1 is a top view of a semiconductor light-emitting device according to a first embodiment of the present disclosure.
Figure 2:
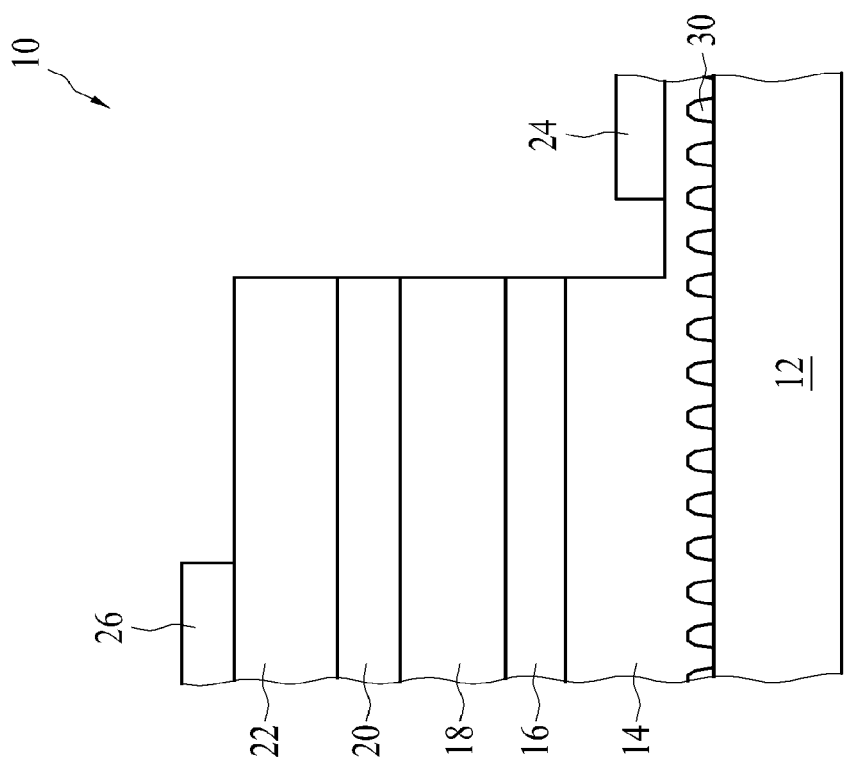
FIG. 2 is a cross-sectional view along the line 1-1 in FIG. 1.

FIG. 1 is a top view of a semiconductor light-emitting device 10 according to a first embodiment of the present disclosure, and FIG. 2 is a cross-sectional view along the cross-sectional line 1-1 in FIG. 1. The semiconductor light-emitting device 10 comprises a substrate 12 having a plurality of bumps 30, an n-type semiconductor layer 14 positioned on the substrate 12, a light-emitting structure 16 positioned on the n-type semiconductor layer 14, a p-type semiconductor layer 18 positioned on the light-emitting structure 16, a contact layer 20 positioned on the p-type semiconductor layer 18, a transparent conductive layer 22 positioned on the contact layer 20, a first electrode 24 positioned on the n-type semiconductor layer 14, and a second electrode 26 positioned on the transparent conductive layer 22.

Figure 3:
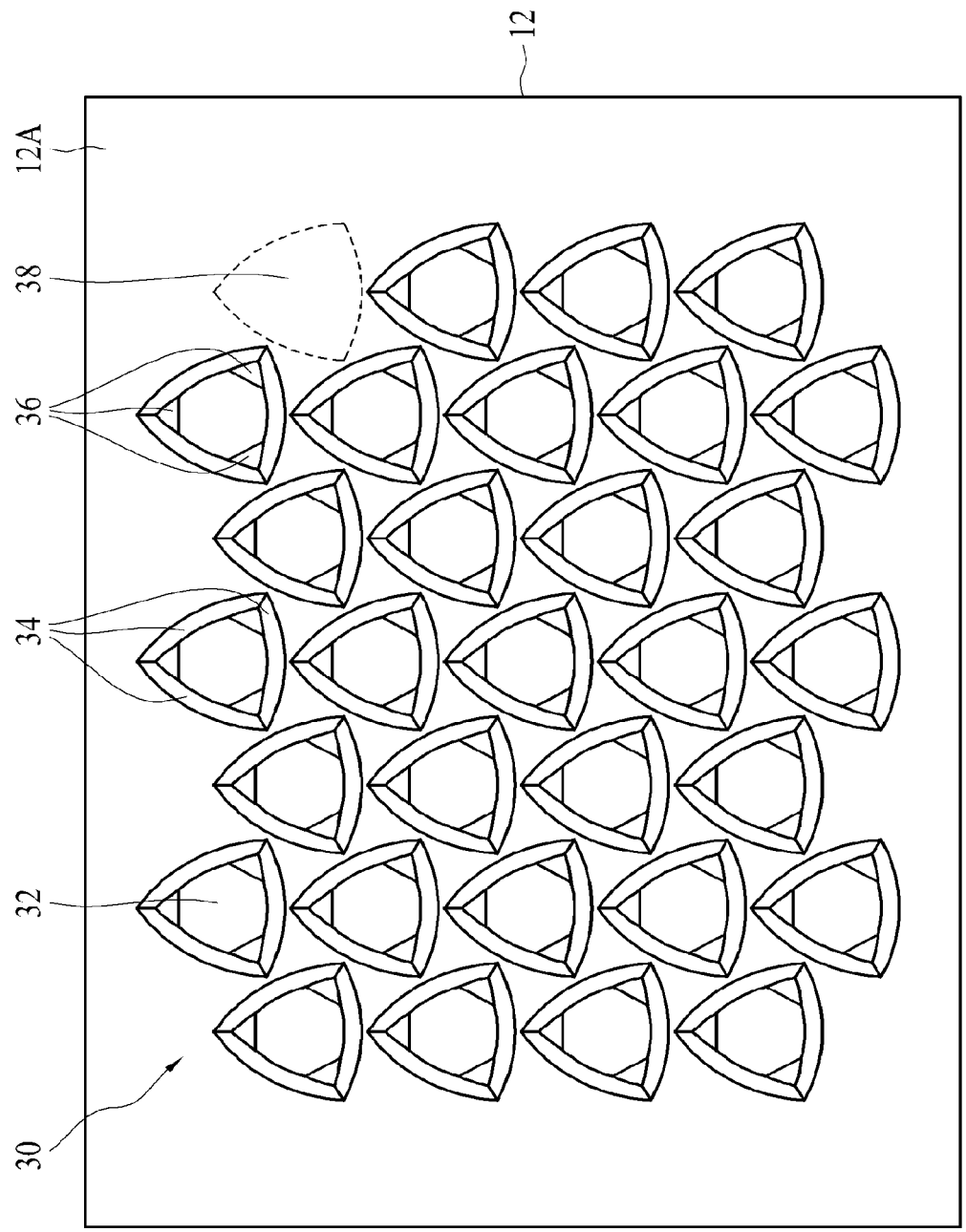
FIG. 3 is a top view of the substrate according to the first embodiment of the present disclosure.
Figure 4:
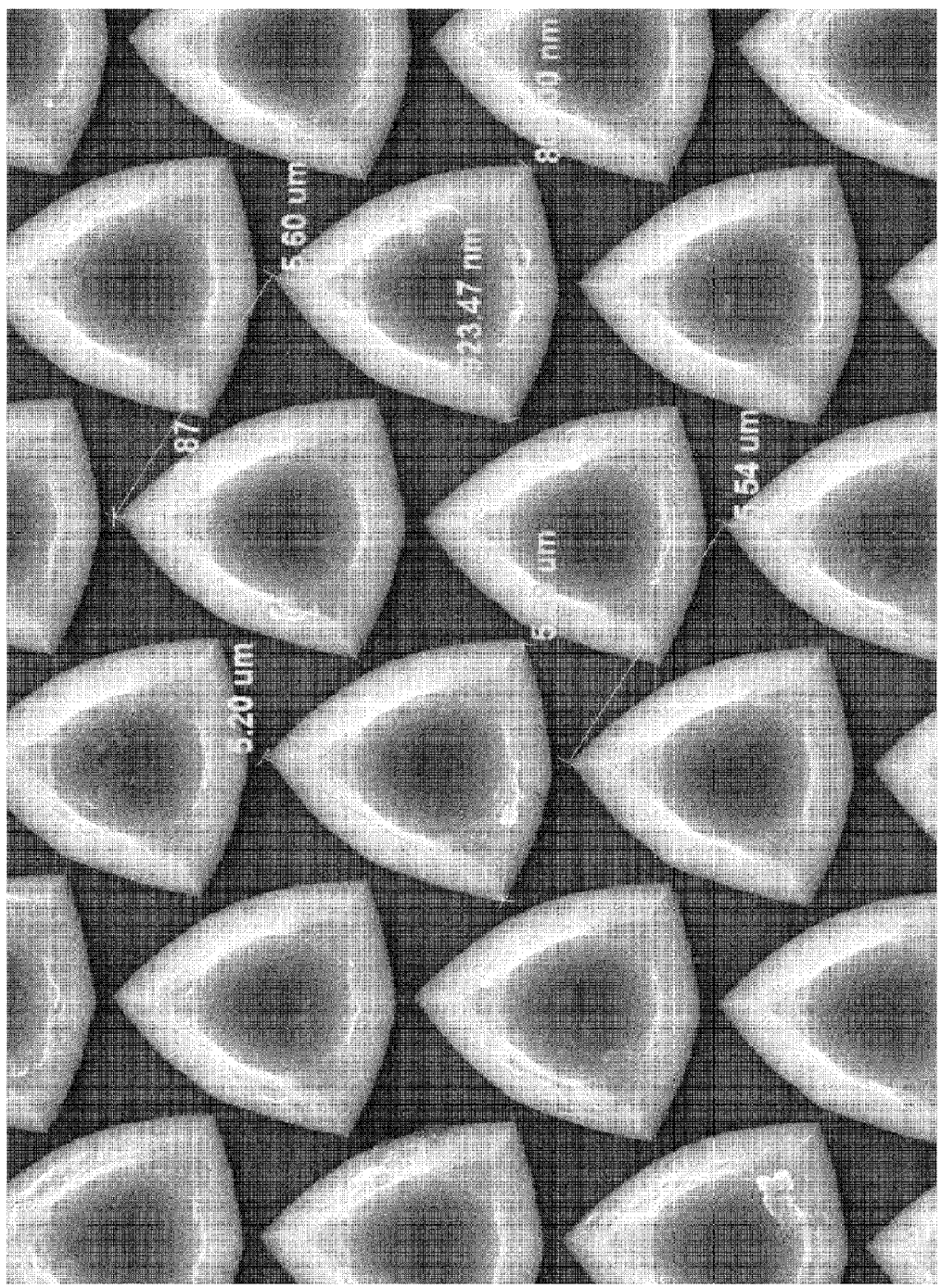
FIG. 4 is a scanning electron microscopy image of the substrate according to the first embodiment of the present disclosure.

FIG. 3 is a top view of the substrate 12 according to the first embodiment of the present disclosure, and FIG. 4 is a scanning electron microscopy image of the substrate 12 according to the first embodiment of the present disclosure. In one embodiment of the present disclosure, the substrate 12 has an upper surface 12A with the bumps 30 positioned on the upper surface 12A in a periodic manner. The bumps 30 are positioned in a plurality of odd rows and a plurality of even rows, and each of the bumps 30 in the even rows is positioned at an interval between adjacent two bumps 30 in the odd rows. The height of the bumps 30 is between 0.5 and 5 microns, the interval between the adjacent two bumps 30 is between 0.5 and 10 microns, and the width of the bumps 30 is between 0.5 and 5 microns.

Each bump 30 has a top plane 32, three wall surfaces 34, and three inclined surfaces 36 sandwiched between the top plane 32 and the wall surfaces 34, wherein each of the inclined surfaces 36 is between two of the wall surfaces 36. The wall surfaces 34 and the inclined surfaces 36 of the bump 30 have different inclined angles, which is the included angle between the upper surface 12A and the wall surface 34 (or the inclined surface 36). The wall surface 34 and the inclined surface 36 are connected, and the included angle between the inclined surface 36 and the wall surface 34 is between 90 and 180 degrees. In addition, the bump 30 has a base surface 38 having three corners, and the connection of the corners is arc-shaped, i.e., the wall surface 34 is arc-shaped.

Figure 5:
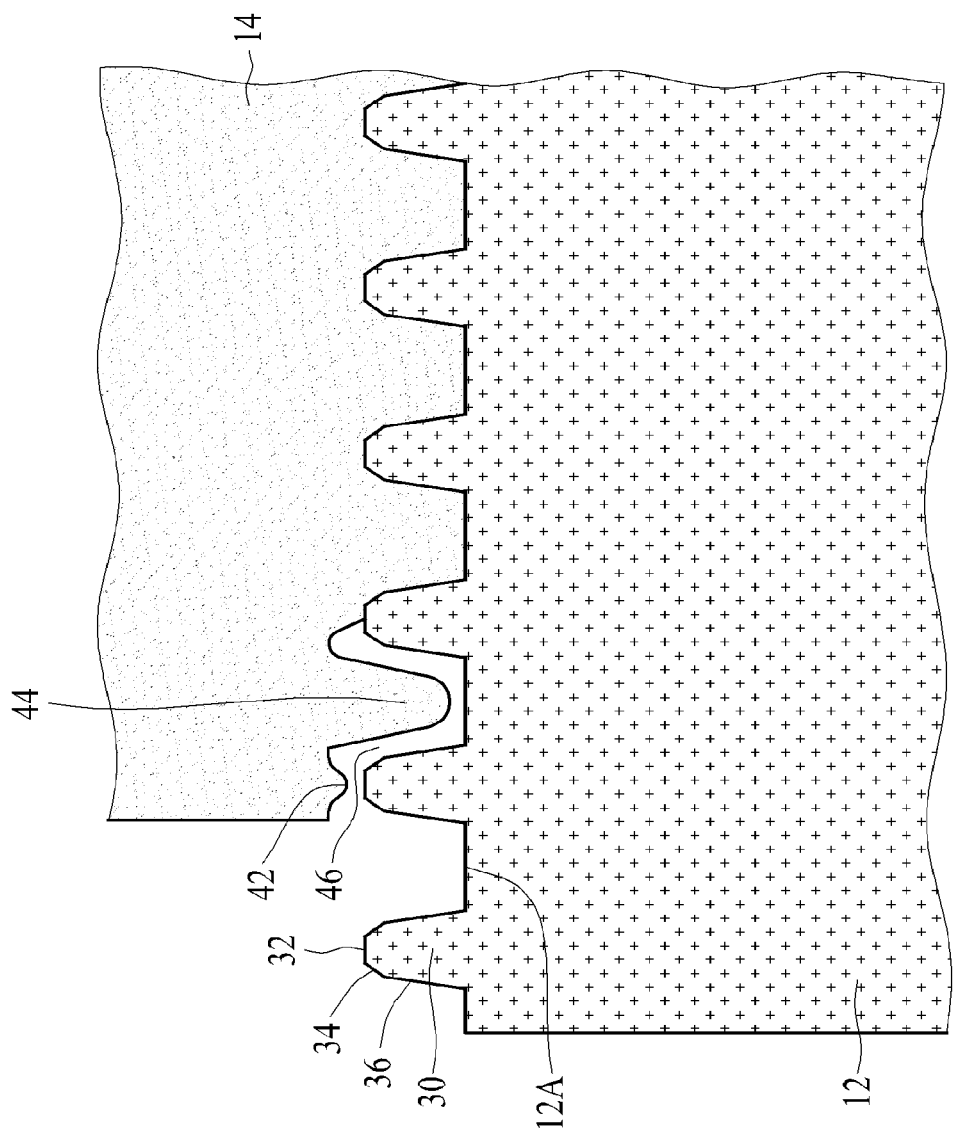
FIG. 5 is a close-up cross-sectional view along the line 1-1 in FIG. 1 according to one embodiment of the present disclosure.
Figure 6:
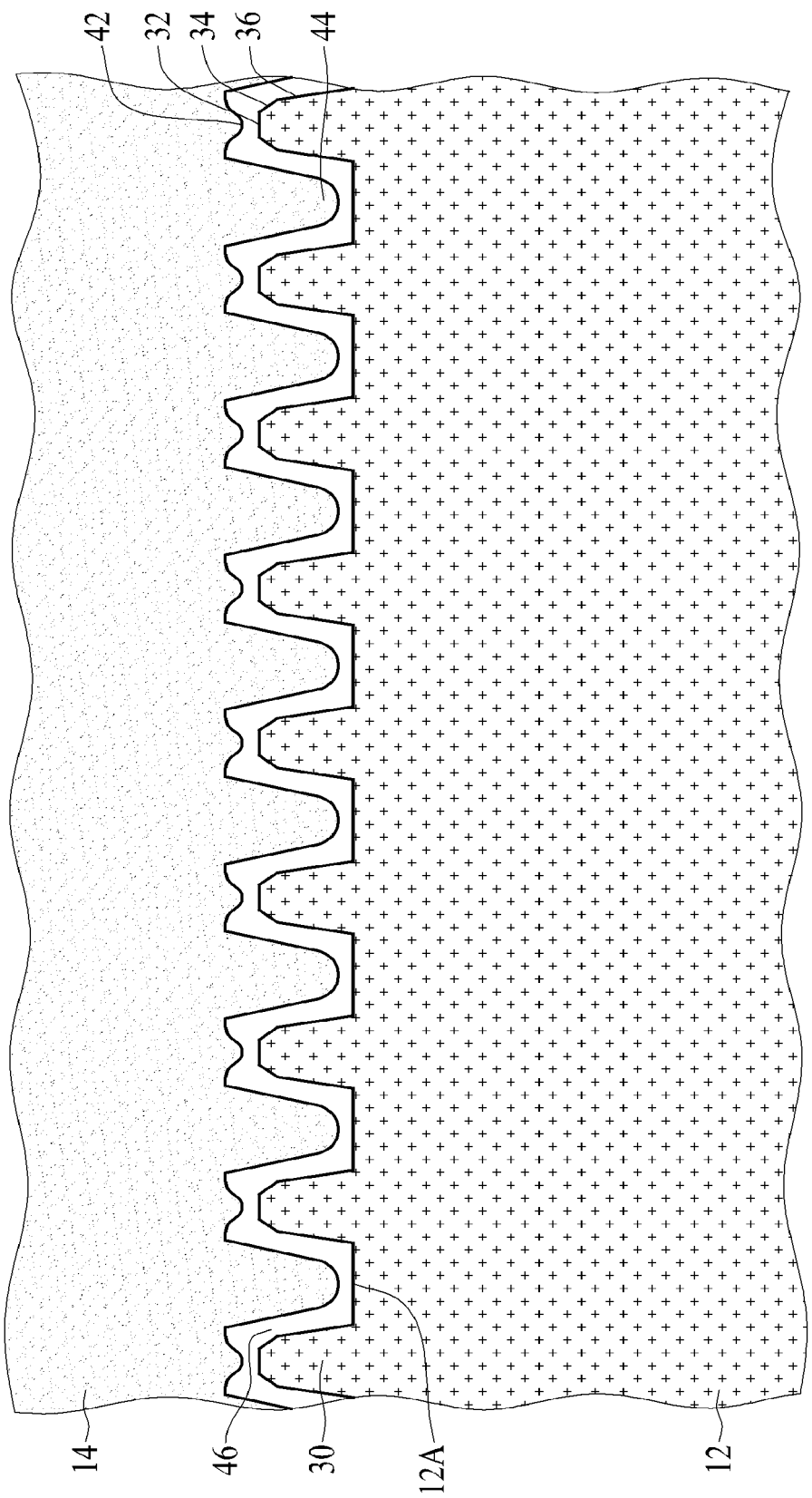
FIG. 6 is a close-up cross-sectional view along the line 2-2 in FIG. 1 according to one embodiment of the present disclosure.
Figure 7:
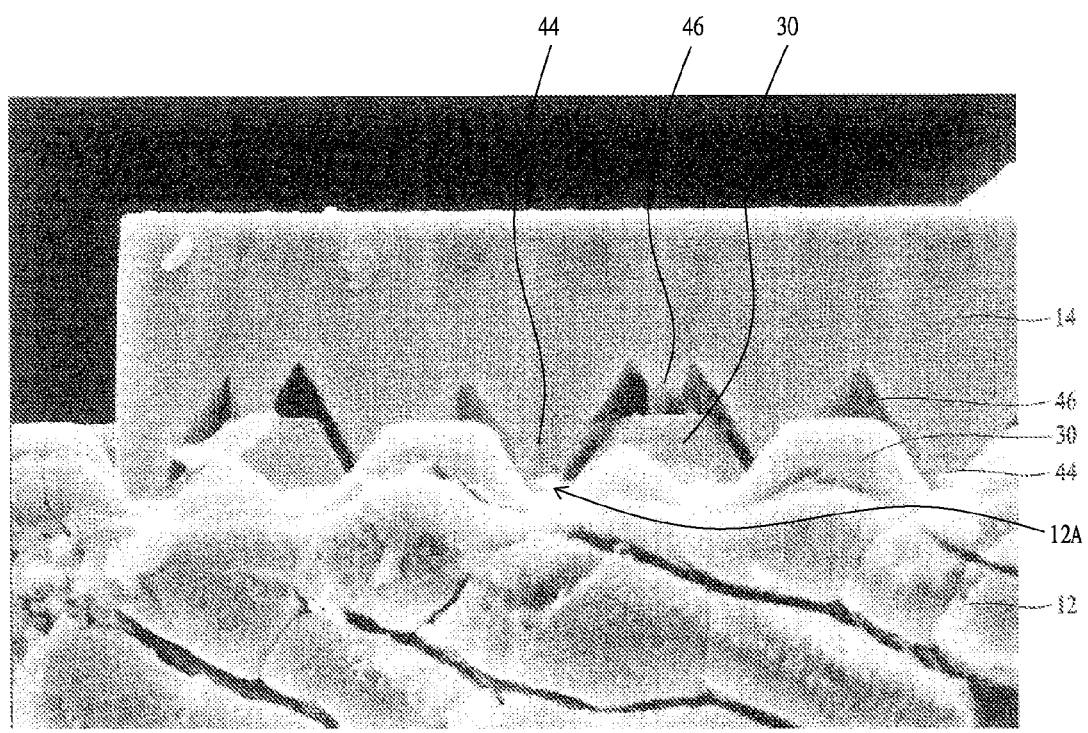
FIG. 7 is a scanning electron microscopy image on the close-up area.

FIG. 5 is a close-up cross-sectional view along the cross-sectional line 1-1 in FIG. 1, FIG. 6 is a close-up cross-sectional view along the cross-sectional line 2-2 in FIG. 1, and FIG. 7 is a scanning electron microscopy image on the close-up area according to one embodiment of the present disclosure. In one embodiment of the present disclosure, the first conductive type semiconductor layer 14 includes a plurality of protrusions 44 each facing a portion of the upper surface 12A of the substrate 12 between the bumps 30. Furthermore, the first conductive type semiconductor layer 14 may optionally include a plurality of projections 42 each facing the top plane 32 of the bumps 30. In one embodiment of the present disclosure, the protrusions 44 are positioned in a ring manner at a peripheral region 40 of the first conductive type semiconductor layer 14, and the width of the peripheral region 40 is between 5 and 10 microns, as shown in FIG. 1.

In one embodiment of the present disclosure, the protrusions 44 are spaced apart from the bumps 30 and the upper surface 12A by a gap such as an air gap 46. Furthermore, the projections 42 are spaced apart from the top plane 32 of the bumps 30 by the air gap 46. The projections 42, the protrusions 44, the air gap 46, the top plane 32, the wall surfaces 34 and the inclined surfaces 36 are configured to scatter and/or diffract the light beams generated by the light-emitting structure 16 to the outside of the semiconductor light-emitting device 10. Consequently, the internal total reflection of the light beams in the light-emitting device 10 can be dramatically decreased to prevent the light beams from being adsorbed by the light-emitting structure 16, so as to improve the light extraction efficiency.

Figure 8:
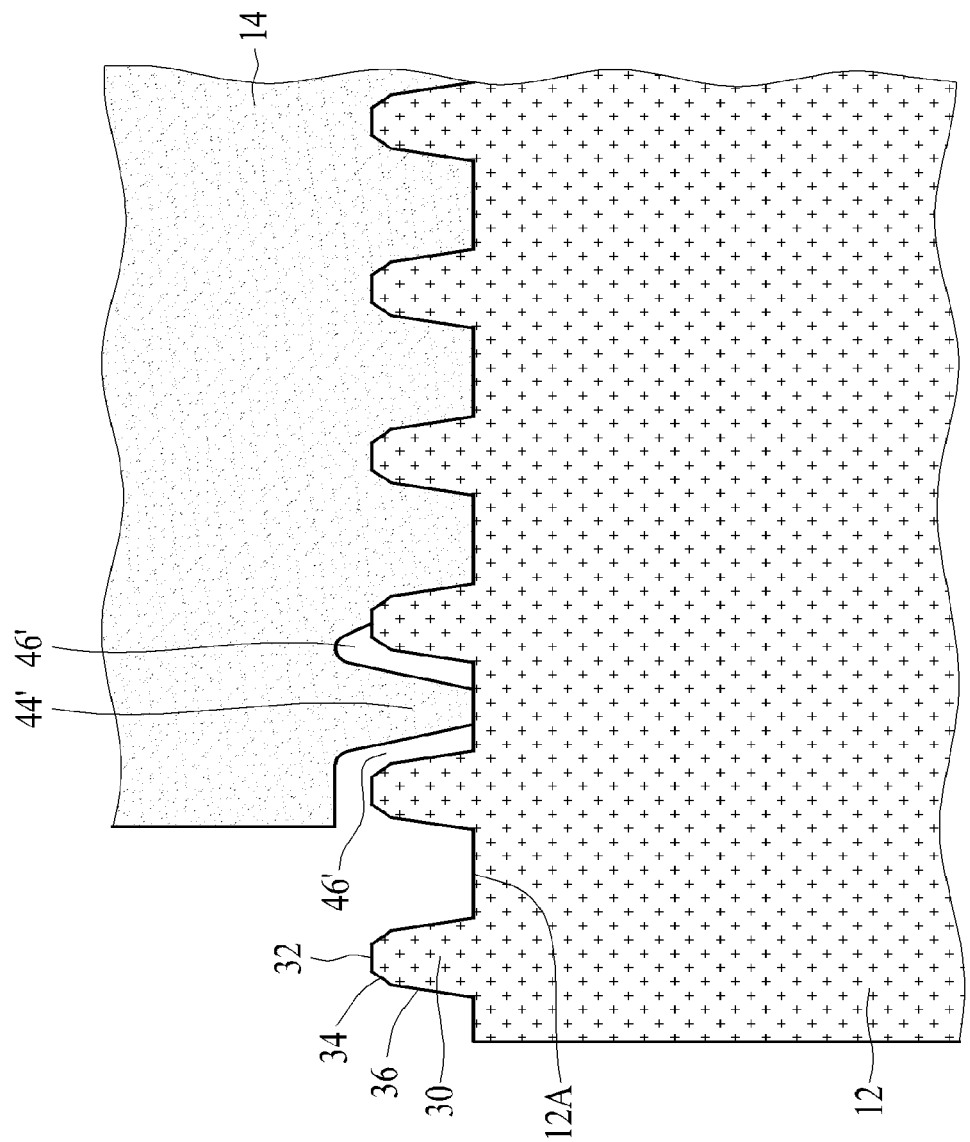
FIG. 8 is a close-up cross-sectional view along the line 1-1 in FIG. 1 according to another embodiment of the present disclosure.
Figure 9:
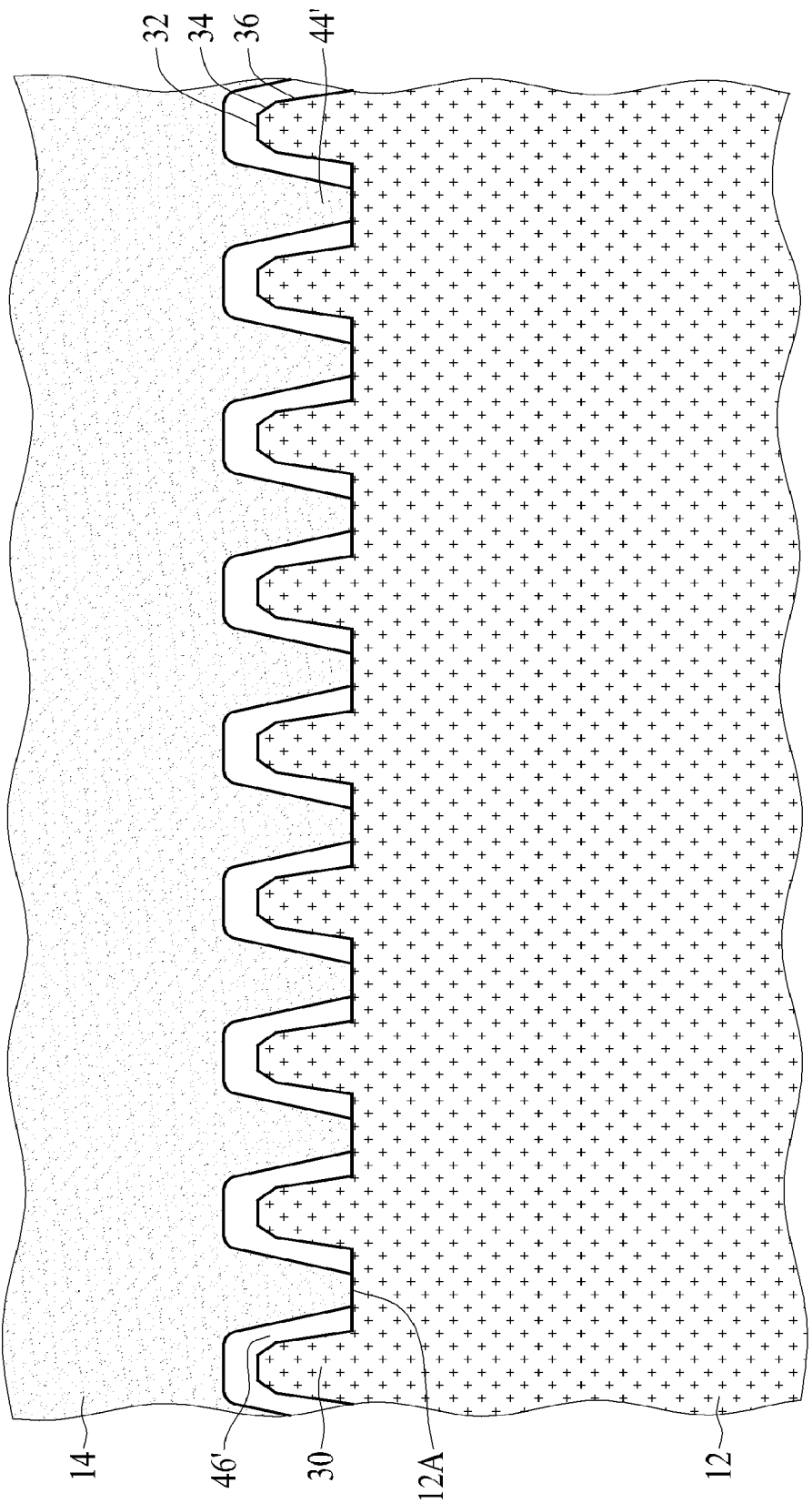
FIG. 9 is a close-up cross-sectional view along the line 2-2 in FIG. 1 according to another embodiment of the present disclosure.

FIG. 8 is a close-up cross-sectional view along the cross-sectional line 1-1 in FIG. 1, and FIG. 9 is a close-up cross-sectional view along the cross-sectional line 2-2 in FIG. 1 according to another embodiment of the present disclosure. In one embodiment of the present disclosure, the first conductive type semiconductor layer 14 includes a plurality of protrusions 44' each facing a portion of the upper surface 12A of the substrate 12 between the bumps 30, the protrusions 44' are positioned in a ring manner at a peripheral region 40 of the first conductive type semiconductor layer 14, and the width of the peripheral region 40 is between 5 and 10 microns, as shown in FIG. 1. Furthermore, the first conductive type semiconductor layer 14 may optionally include a plurality of projections (not shown in FIG. 8 and FIG. 9) each facing the top plane 32 of the bumps 30, similar to the projection 42 shown in FIG. 5.

In one embodiment of the present disclosure, the protrusions 44' contact the portion of the substrate 12 between the bumps 30, and are spaced apart from the bumps 30 by a gap such as an air gap 46'. Furthermore, the protrusions 44', the air gap 46', the top plane 32, the wall surfaces 34 and the inclined surfaces 36 are configured to scatter and/or diffract the light beams generated by the light-emitting structure 16 to the outside of the semiconductor light-emitting device 10. Consequently, the internal total reflection of the light beams in the light-emitting device 10 can be dramatically decreased to prevent the light beams from being adsorbed by the light-emitting structure 16, so as to improve the light extraction efficiency.

In one embodiment of the present disclosure, the air gap 46 or 46' can be formed by performing a wet etching process after the epitaxy process of the first conductive type semiconductor layer 14. The etchant of the wet etching process may include hydrofluoric acid, nitric acid, phosphoric acid, base solution, or mixture of base solution and alcohol, which etches the first conductive type semiconductor layer 14 along the interface between the bumps 30 of the substrate 12 and the first conductive type semiconductor layer 14. The projections 42 may be removed by the wet etching process such that the first conductive type semiconductor layer 14 only has the protrusion 44 or 44' facing the substrate 12.

In one embodiment of the present disclosure, the substrate 12 includes transparent insulation material such as sapphire, silicon, or silicon carbide; the n-type semiconductor layer 14, the light-emitting structure 16 and the p-type semiconductor layer 18 may include III-V material selected from the group consisting of AlGaN, GaN, InGaN, AlGaInN, GaP, or GaAsP; the contact layer 20 includes III-V material such as such as AlGaN, GaN, InGaN, AlGaInN, GaP, or GaAsP; the transparent conductive layer 22 includes indium oxide, tin oxide or indium tin oxide; and the light-emitting structure 16 may include the quantum well or multi-quantum well structure sandwiched between a p-cladding layer and an n-cladding layer on the n-type semiconductor layer 114. In addition, the n-type semiconductor layer 14, the light-emitting structure 16 and the p-type semiconductor layer 18 may include II-VI material selected from the group consisting of ZnCdSe, ZnMgSe, ZnBaSe, ZnBeSe, ZnCaSe, ZnSrSe, ZnCdSSe, ZnMgSSe, ZnCdTe, ZnMgTe, ZnBaTe, ZnBeTe, ZnCaTe, ZnSrTe, ZnCdSTe and ZnMgSTe. In particular, the epitaxy machine can be used to prepare these layers on the substrate 12.

In one embodiment of the present disclosure, the top plane 32 is a C-plane (0,0,1) substantially parallel to the upper surface 12A of the substrate 12. The preparation of the bumps 30 may include the steps of forming a mask having a plurality of patterns covering a portion of the substrate, and performing an etching process to remove a portion of the substrate not covered by the mask to form the bumps 30 under the patterns. In one embodiment of the present disclosure, the etching process is a wet etching process using an etchant including phosphoric acid.

Figure 10:
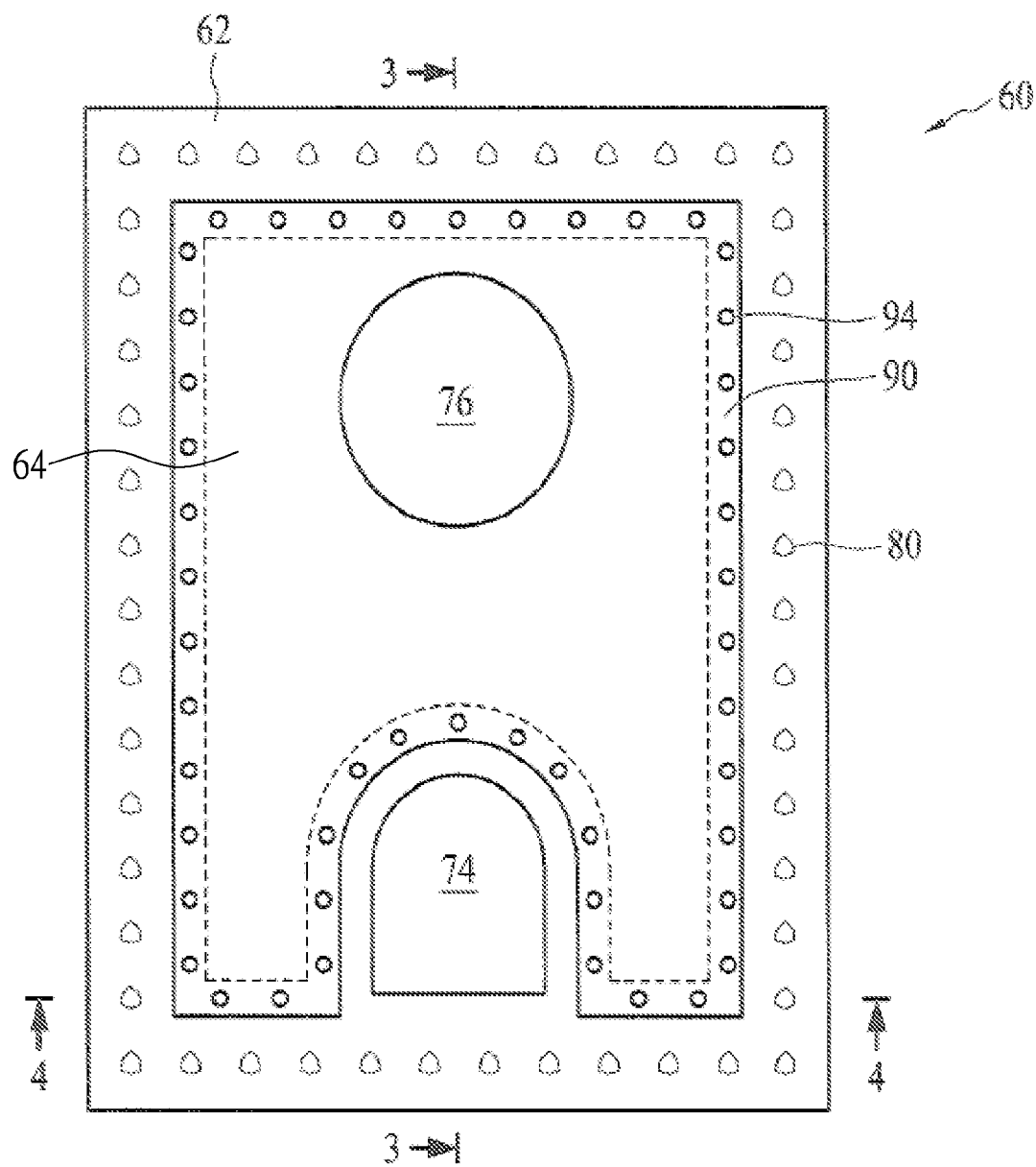
FIG. 10 is a top view of a semiconductor light-emitting device according to a second embodiment of the present disclosure.
Figure 11:
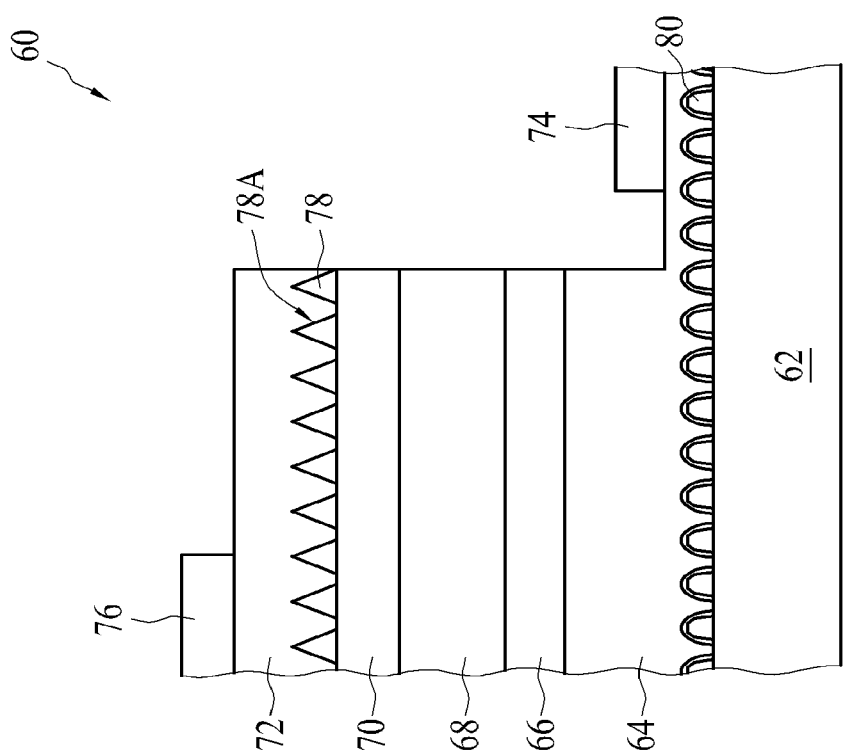
FIG. 11 is a cross-sectional view along the line 3-3 in FIG. 10.

FIG. 10 is a top view of a semiconductor light-emitting device 60 according to a second embodiment of the present disclosure, and FIG. 11 is a cross-sectional view along the cross-sectional line 3-3 in FIG. 10. The semiconductor light-emitting device 60 comprises a substrate 62, an n-type semiconductor layer 64 positioned on the substrate 62, a light-emitting structure 66 positioned on the n-type semiconductor layer 64, a p-type semiconductor layer 68 positioned on the light-emitting structure 66, a contact layer 70 positioned on the p-type semiconductor layer 68, a crystal layer 78 positioned on the contact layer 70, a transparent conductive layer 72 positioned on the crystal layer 78, a first electrode 74 positioned on the n-type semiconductor layer 64, and a second electrode 76 positioned on the transparent conductive layer 72. In one embodiment of the present disclosure, the crystal layer 78 includes a plurality of bumps 78A configured to improve the propagation of the light beams from the light-emitting structure 66 to the outside of the light-emitting device 60 so as to increase the light-emitting efficiency.

Figure 12:
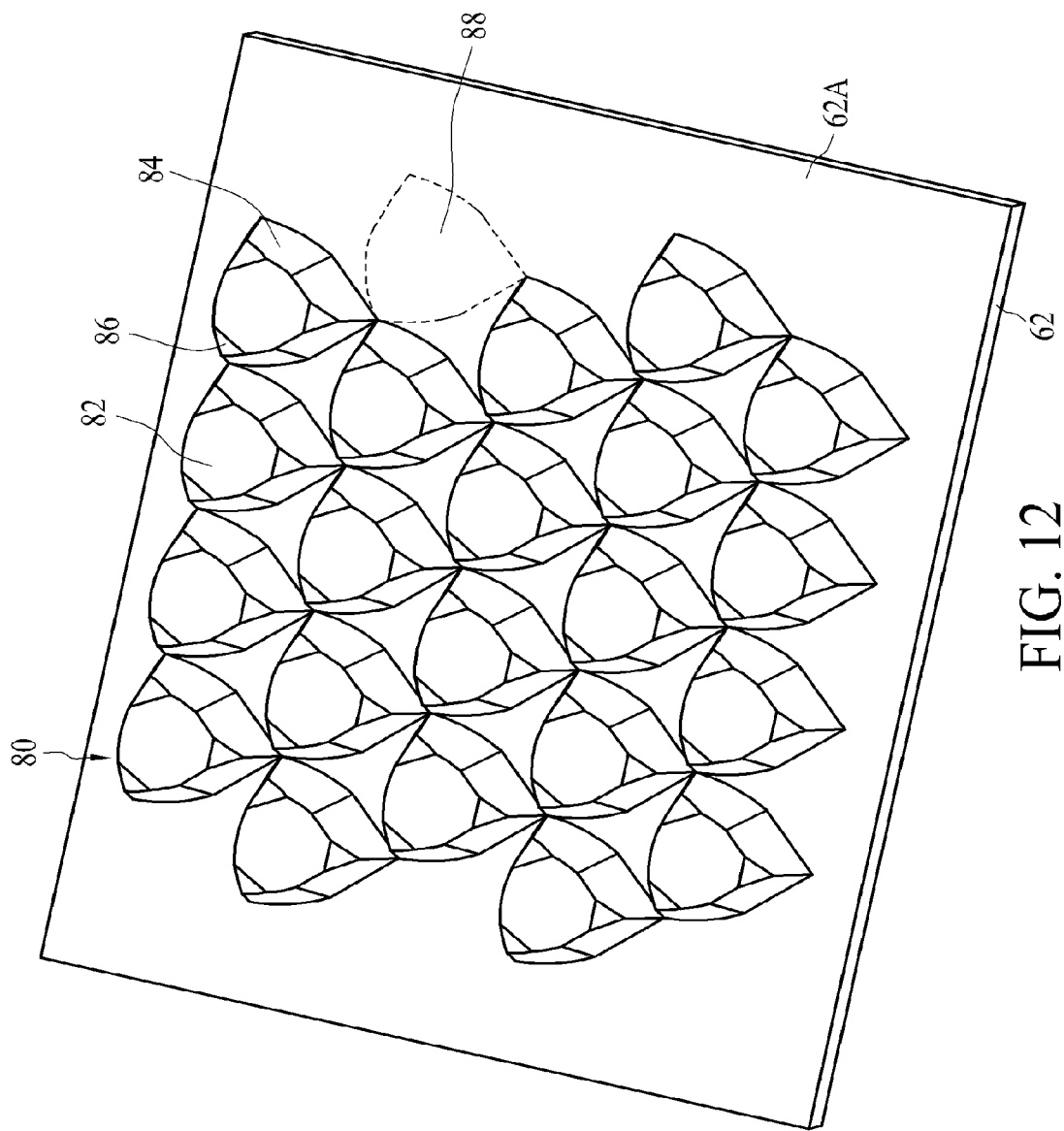
FIG. 12 is a full view of the substrate of the semiconductor light-emitting device of FIG. 10.

FIG. 12 is a full view of the substrate 62 according to the second embodiment of the present disclosure. In one embodiment of the present disclosure, the substrate 62 has an upper surface 62A and a plurality of bumps 80 positioned on the upper surface 62A in a periodic manner. The bumps 80 are positioned in a plurality of odd rows and a plurality of even rows, and each of the bumps 80 in the even rows is positioned at an interval between adjacent two bumps 80 in the odd rows. The height of the bumps 80 is between 0.5 and 5 microns, the interval between the adjacent two bumps 80 is between 0.5 and 10 microns, and the width of the bumps 80 is between 0.5 and 5 microns.

Each bump 80 has a top plane 82, five wall surfaces 84, and three inclined surfaces 86 sandwiched between the top plane 82 and the wall surfaces 84, wherein each of the inclined surfaces 86 is between two of the wall surfaces 84. The wall surface 84 and the inclined surface 86 of the bump 80 have different inclined angles, which is the included angle between the upper surface 62A and the wall surface 84 (or the inclined surface 86). The wall surface 84 and the inclined surface 86 are connected, and the included angle between the inclined surface 86 and the wall surface 84 is between 90 and 180 degrees. In addition, the bump 80 has a base surface 88 having five corners, and the connections of the corners is arc-shaped, i.e., the wall surface 84 is arc-shaped.

Figure 13:
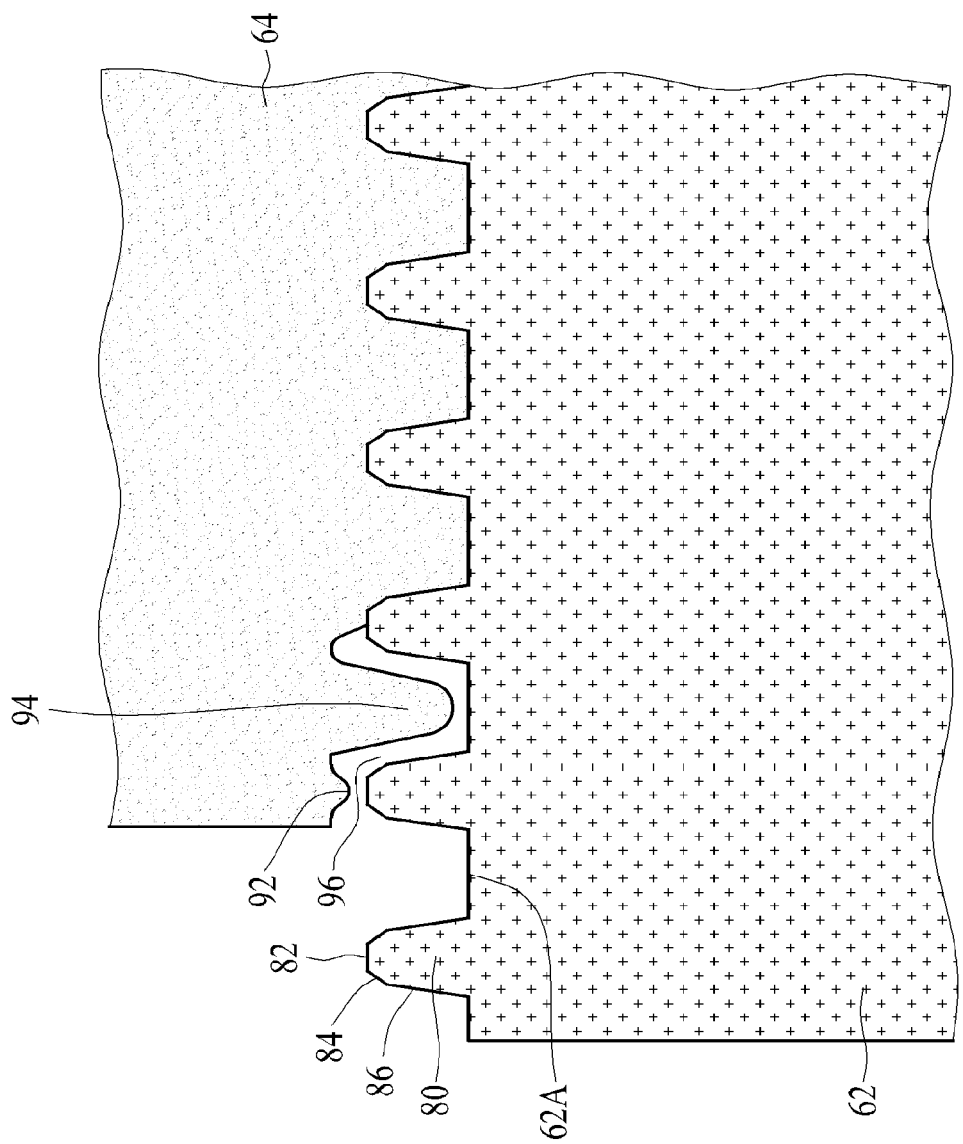
FIG. 13 is a close-up cross-sectional view along the line 3-3 in FIG. 10 according to one embodiment of the present disclosure.
Figure 14:
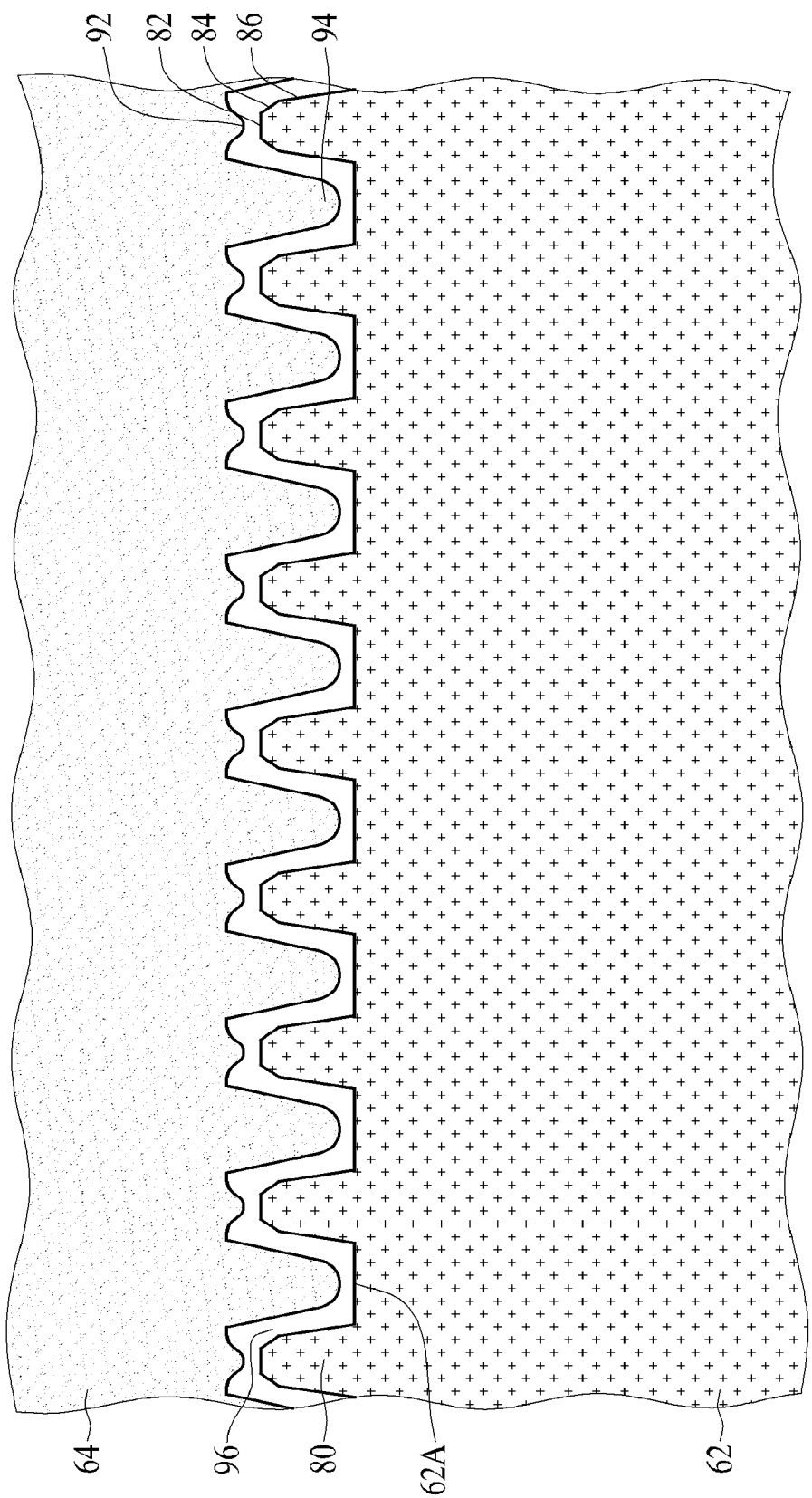
FIG. 14 is a close-up cross-sectional view along the line 4-4 in FIG. 10 according to one embodiment of the present disclosure.

FIG. 13 is a close-up cross-sectional view along the cross-sectional line 3-3 in FIG. 10, and FIG. 14 is a close-up cross-sectional view along the cross-sectional line 4-4 in FIG. 10 according to one embodiment of the present disclosure. In one embodiment of the present disclosure, the first conductive type semiconductor layer 64 includes a plurality of protrusions 94 each facing a portion of the upper surface 62A of the substrate 62 between the bumps 80. Furthermore, the first conductive type semiconductor layer 64 may optionally includes a plurality of projections 92 each facing the top plane 82 of the bumps 80. In one embodiment of the present disclosure, the protrusions 94 are positioned in a ring manner at a peripheral region 90 of the first conductive type semiconductor layer 64, and the width of the peripheral region 90 is between 5 and 10 microns, as shown in FIG. 13.

In one embodiment of the present disclosure, the protrusions 94 are spaced apart from the bumps 80 and the portion of the substrate 62 between the bumps 80 by a gap such as an air gap 96. Furthermore, the projections 92 are spaced apart from the top plane 82 of the bumps 80 by the air gap 96. The projections 92, the protrusion 94, the air gap 96, the top plane 82, the wall surfaces 84 and the inclined surfaces 86 are configured to scatter and/or diffract the light beams generated by the light-emitting structure 66 to the outside of the light-emitting device 60. Consequently, the internal total reflection of the light beams in the light-emitting device 60 can be dramatically decreased to prevent the light beams from being adsorbed by the light-emitting structure 66, so as to improve the light extraction efficiency.

Figure 15:
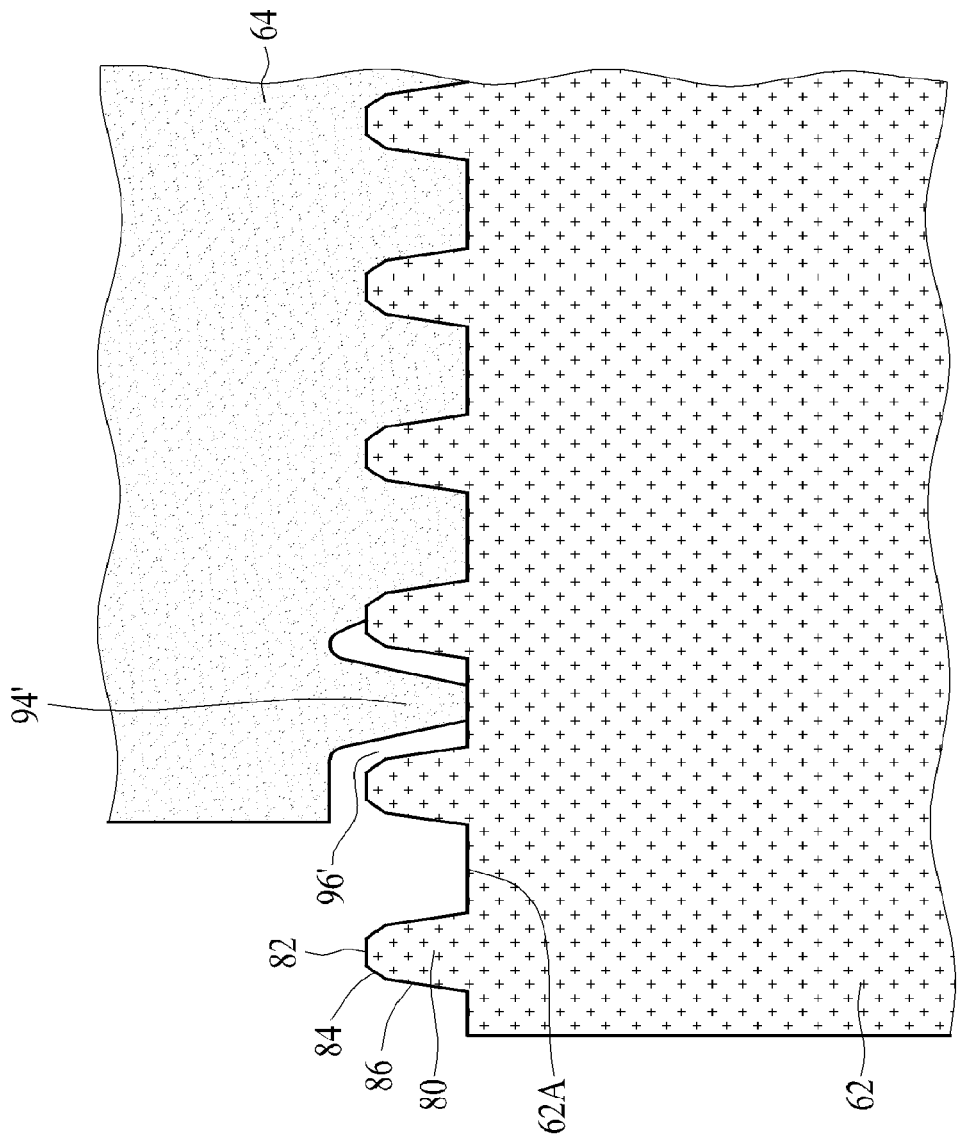
FIG. 15 is a close-up cross-sectional view along the line 3-3 in FIG. 10 according to another embodiment of the present disclosure.
Figure 16:
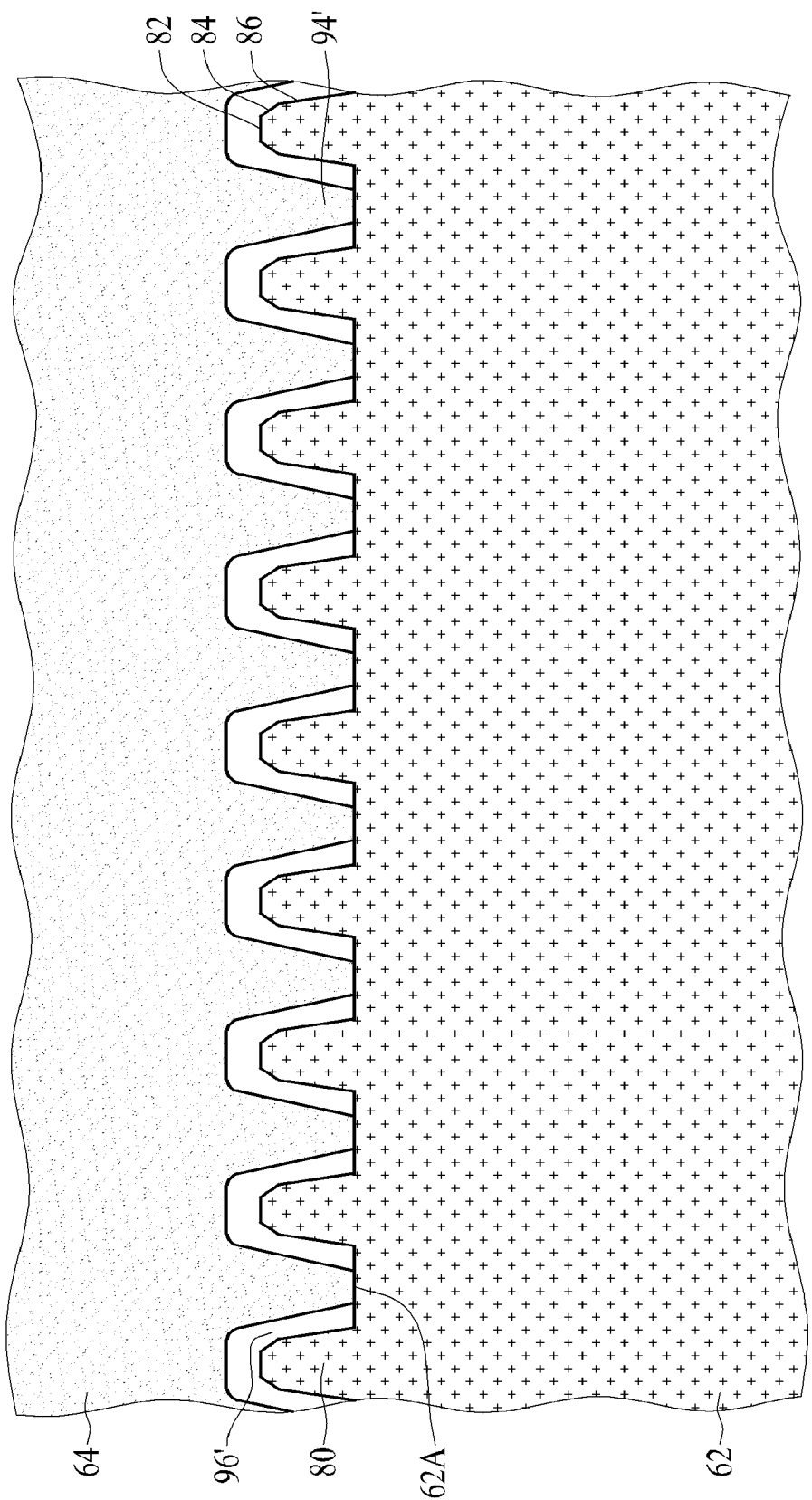
FIG. 16 is a close-up cross-sectional view along the line 4-4 in FIG. 10 according to another embodiment of the present disclosure.

FIG. 15 is a close-up cross-sectional view along the cross-sectional line 3-3 in FIG. 10, and FIG. 16 is a close-up cross-sectional view along the cross-sectional line 4-4 in FIG. 10 according to another embodiment of the present disclosure. In one embodiment of the present disclosure, the first conductive type semiconductor layer 64 includes a plurality of protrusions 94' each facing a portion of the upper surface 62A of the substrate 62 between the bumps 80, the protrusions 94' are positioned in a ring manner at a peripheral region 90 of the first conductive type semiconductor layer 64, and the width of the peripheral region 90 is between 5 and 10 microns, as shown in FIG. 10. Furthermore, the first conductive type semiconductor layer 64 may optionally include a plurality of projections (not shown in FIG. 15 or FIG. 16) each facing the top plane 82 of the bumps 80, similar to the projection 92 shown in FIG. 13.

In one embodiment of the present disclosure, the protrusions 94' contact the portion of the substrate 62 between the bumps 80, and are spaced apart from the bumps 80 by a gap such as an air gap 96'. Furthermore, the protrusions 94', the air gap 96', the top plane 82, the wall surfaces 84 and the inclined surfaces 86 are configured to scatter and/or diffract the light beams generated by the light-emitting structure 66 to the outside of the semiconductor light-emitting device 60. Consequently, the internal total reflection of the light beams in the light-emitting device 60 can be dramatically decreased to prevent the light beams from being adsorbed by the light-emitting structure 66, so as to improve the light extraction efficiency.

In one embodiment of the present disclosure, the air gap 96 or 96' can be formed by performing a wet etching process after the epitaxy process of the first conductive type semiconductor layer 64. The etchant of the wet etching process may include hydrofluoric acid, nitric acid, phosphoric acid, base solution, or mixture of base solution and alcohol, which etches the first conductive type semiconductor layer 64 along the interface between the bumps 80 of the substrate 62 and the first conductive type semiconductor layer 64. The projections 92 may be removed by the wet etching process such that the first conductive type semiconductor layer 64 only has the protrusion 94 or 94' facing the substrate 62.

In one embodiment of the present disclosure, the substrate 62 includes transparent insulation material such as sapphire, silicon, or silicon carbide; the n-type semiconductor layer 64, the light-emitting structure 66 and the p-type semiconductor layer 68 may include III-V material selected from the group consisting of AlGaN, GaN, InGaN, AlGaInN, GaP, or GaAsP; the contact layer 70 includes III-V material selected from the group consisting of AlGaN, GaN, InGaN, AlGaInN, GaP, or GaAsP; the transparent conductive layer 72 includes indium oxide, tin oxide or indium tin oxide; and the light-emitting structure 66 may include the quantum well or multi-quantum well structure sandwiched between a p-cladding layer and an n-cladding layer on the n-type semiconductor layer 64. In addition, the n-type semiconductor layer 64, the light-emitting structure 66 and the p-type semiconductor layer 68 may include II-VI material selected from the group consisting of ZnCdSe, ZnMgSe, ZnBaSe, ZnBeSe, ZnCaSe, ZnSrSe, ZnCdSSe, ZnMgSSe, ZnCdTe, ZnMgTe, ZnBaTe, ZnBeTe, ZnCaTe, ZnSrTe, ZnCdSTe and ZnMgSTe. In particular, the epitaxy machine can fabricate these layers on the substrate 62.

In one embodiment of the present disclosure, the top plane 82 is a C-plane (0,0,1) substantially parallel to the upper surface 62A of the substrate 62. The preparation of the bumps 80 may include the steps of forming a mask having a plurality of patterns covering a portion of the substrate, and performing an etching process to remove a portion of the substrate not covered by the mask to form the bumps 80 under the patterns. In one embodiment of the present disclosure, the etching process is a wet etching process using an etchant including phosphoric acid.

FIG. 13 is a top view of a semiconductor light-emitting device 110 according to a third embodiment of the present disclosure, and FIG. 14 is a cross-sectional view along the cross-sectional line 5-5 in FIG. 13. The semiconductor light-emitting device 110 comprises a substrate 112, an n-type semiconductor layer 114 positioned on the substrate 112, a light-emitting structure 116 positioned on the n-type semiconductor layer 114, a p-type semiconductor layer 118 positioned on the light-emitting structure 116, a contact layer 120 positioned on the p-type semiconductor layer 118, a crystal layer 128 positioned on the contact layer 120, a transparent conductive layer 122 positioned on the crystal layer 128, a first electrode 124 positioned on the n-type semiconductor layer 114, and a second electrode 126 positioned on the transparent conductive layer 122. In one embodiment of the present disclosure, the crystal layer 128 includes a plurality of depressions 128A configured to improve the propagation of the light beams propagating from the light-emitting structure 116 to the outside of the light-emitting device 110 so as to increase the light-emitting efficiency.

FIG. 15 is a full view of the substrate 112 according to the third embodiment of the present disclosure, and FIG. 16 is a scanning electron microscopy image of the substrate 112 according to the third embodiment of the present disclosure. In one embodiment of the present disclosure, the substrate 112 has an upper surface 112A and a plurality of bumps 130 positioned on the upper surface 112A in a periodic manner. The bumps 130 are positioned in a plurality of odd rows and a plurality of even rows, and each of the bumps 130 in the even rows is positioned at an interval between adjacent two bumps 130 in the odd rows. The height of the bumps 130 is between 0.5 and 5 microns, the interval between the adjacent two bumps 130 is between 0.5 and 10 microns, and the width of the bumps 130 is between 0.5 and 5 microns.

Each bump 130 has a top plane 132, a ridge portion 140, a plurality of wall surfaces 134, and a plurality of inclined surfaces 136. The ridge portion 140 has a plurality of branches 142, the wall surfaces 134 are sandwiched between the branches 142, and the inclined surfaces 136 are positioned on free ends of the branches 142, with the free ends being adjacent to the upper surface 112A. In one embodiment of the present disclosure, the ridge portion 140 includes three branches 142, and the bump 130 includes three wall surfaces 134 and three inclined surfaces 136. The top plane 132 of the bump 130 connects the branches 142, i.e., the top plane 133 is sandwiched among the branches 142. In addition, the top plane 132 can be dart-shaped, and the ridge portion 140 is above the wall surface 134.

The wall surface 134 and the inclined surface 136 of the bump 130 have different inclined angles, which is the included angle between the upper surface 112A and the wall surface 134 (or the inclined surface 136). The wall surface 134 and the inclined surface 136 are connected, and the included angle between the inclined surface 136 and the wall surface 134 is between 90 and 180 degrees. The different inclined angles are configured to reflect the light beams generated by the light-emitting structure 116 at different reflection angles. In addition, the bump 130 has a base surface 138 having three corners, and the connection of the corners is arc-shaped, i.e., the wall surface 134 is arc-shaped. The ridge portion 140, the wall surface 134, the inclined surface 136, and the top plane 132 can reflect the light beams generated by the light-emitting structure 116 at any angle to the outside of the light-emitting device 100.

Consequently, the repeated internal reflection of the light beams in the light-emitting device 100 is decreased dramatically to prevent the light beams from being adsorbed by the light-emitting structure 116, so as to improve the light extraction efficiency.

Figure 17:
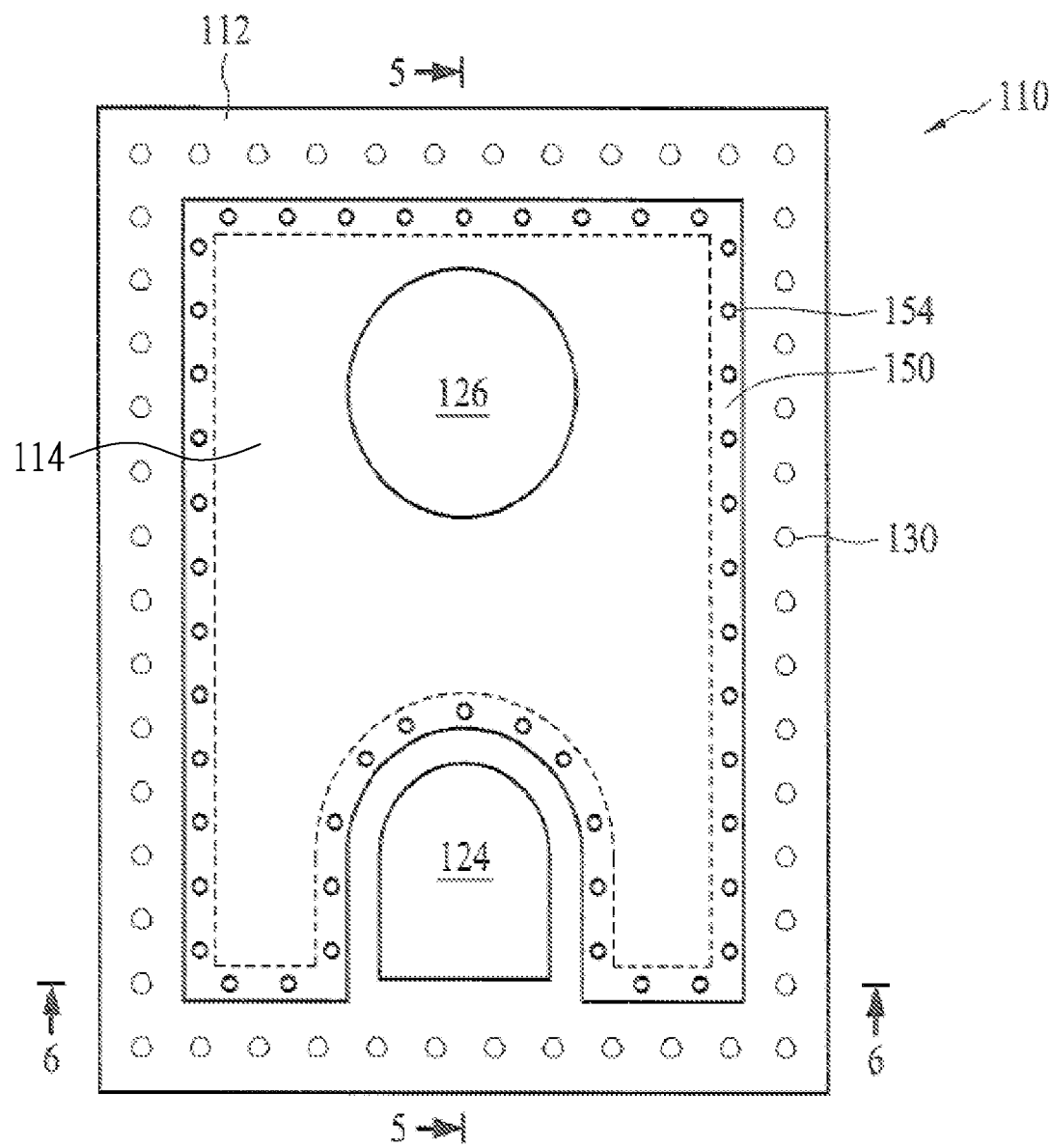
FIG. 17 is a top view of a semiconductor light-emitting device according to a third embodiment of the present disclosure.
Figure 18:
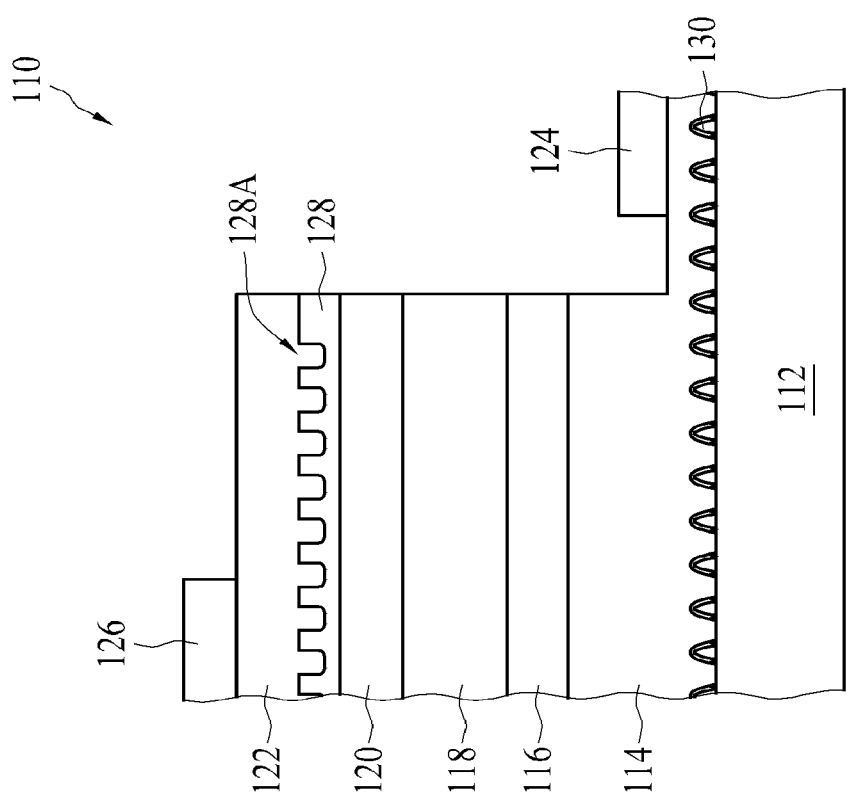
FIG. 18 is a cross-sectional view along the line 5-5 in FIG. 17.
Figure 19:
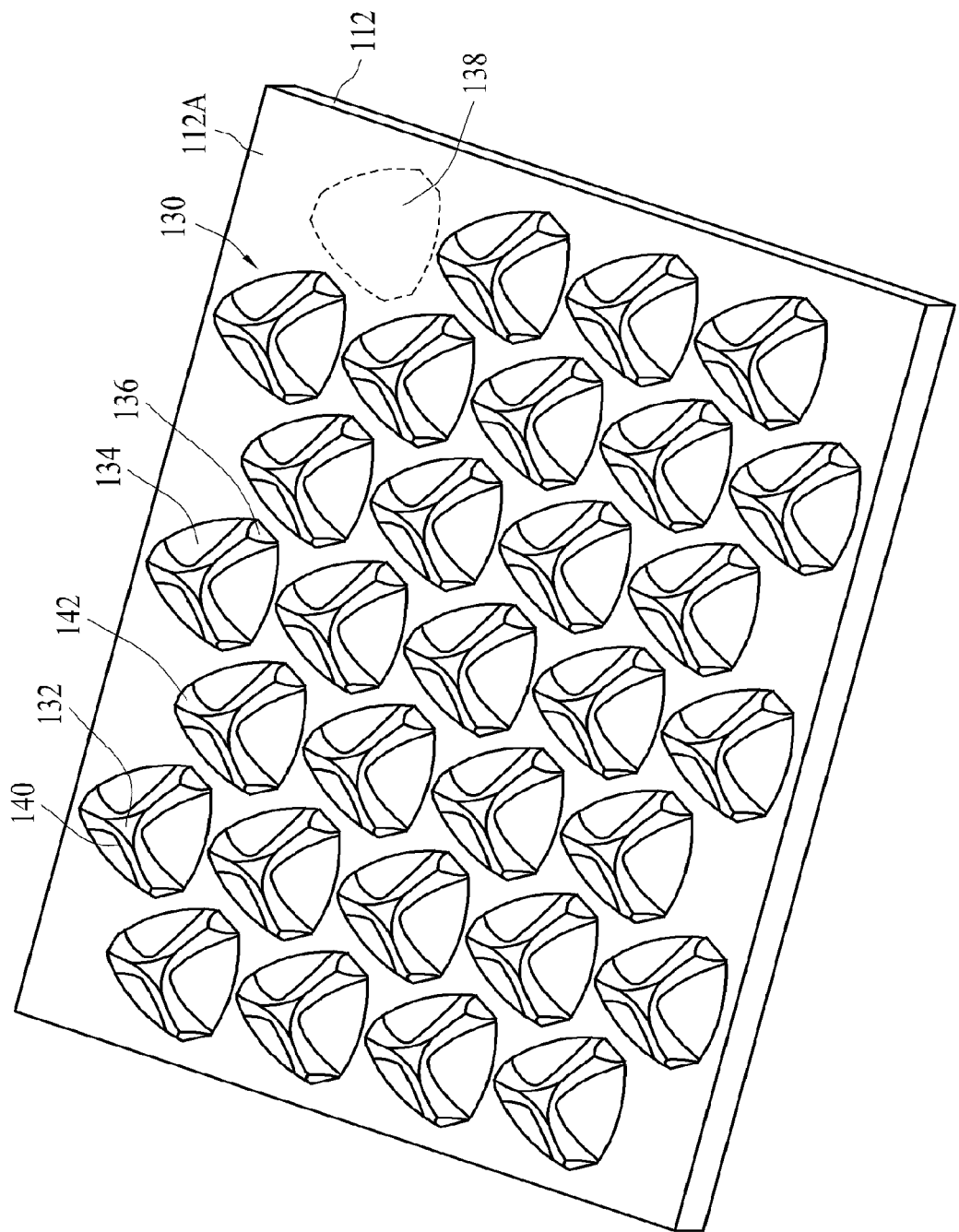
FIG. 19 is a full view of the substrate according to the third embodiment of the present disclosure.
Figure 20:
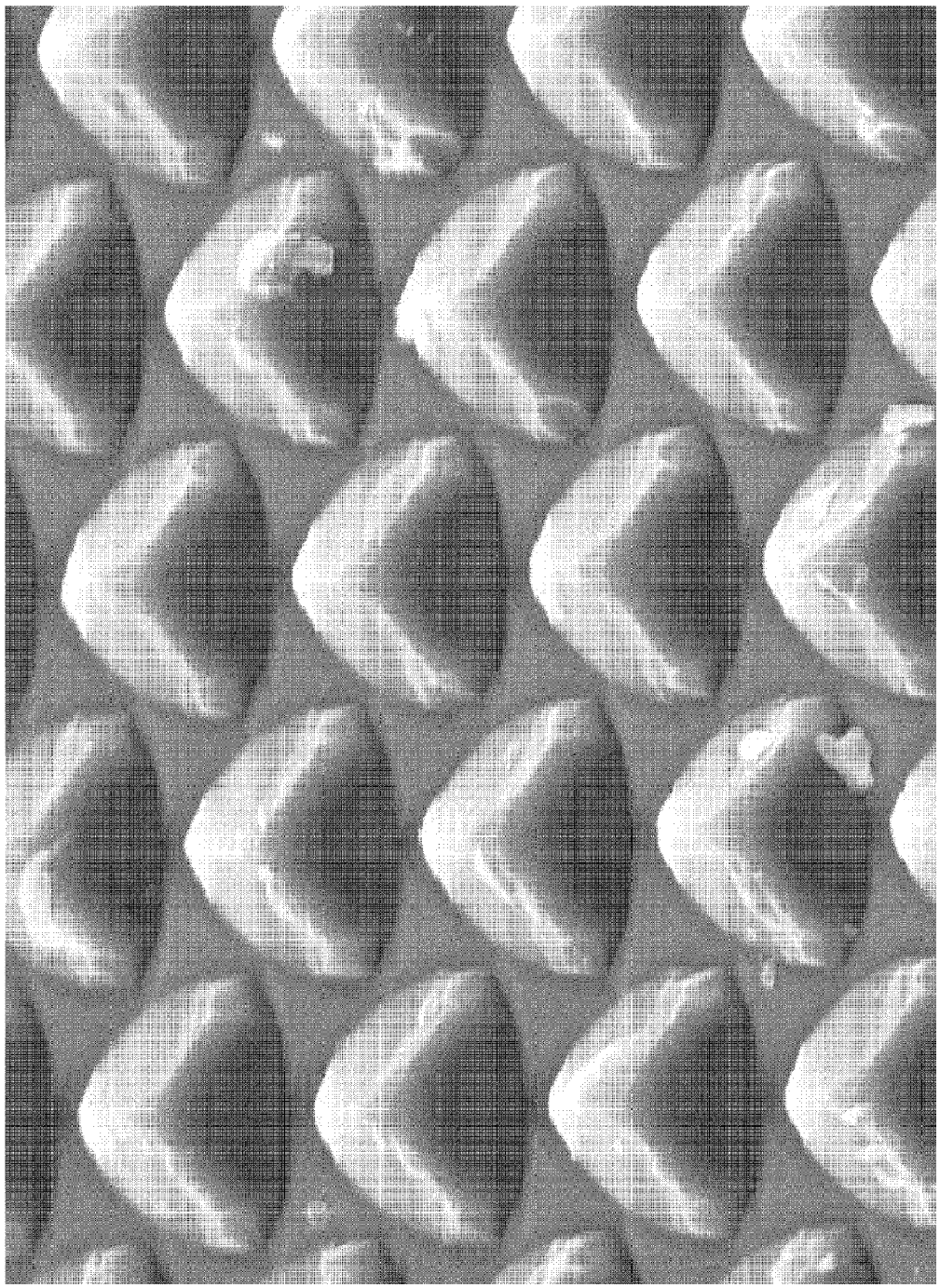
FIG. 20 is a scanning electron microscopy image of the substrate according to the third embodiment of the present disclosure.

FIG. 17 is a close-up cross-sectional view along the cross-sectional line 5-5 in FIG. 13, and FIG. 18 is a close-up cross-sectional view along the cross-sectional line 6-6 in FIG. 13. In one embodiment of the present disclosure, the first conductive type semiconductor layer 114 includes a plurality of protrusions 154 each facing a portion of the upper surface 112A of the substrate 112 between the bumps 130. Furthermore, the first conductive type semiconductor layer 114 may optionally include a plurality of projections 152 each facing the top plane 132 of the bumps 130. In one embodiment of the present disclosure, the protrusions 154 are positioned in a ring manner at a peripheral region 150 of the first conductive type semiconductor layer 114, and the width of the peripheral region 150 is between 5 and 10 microns, as shown in FIG. 17.

In one embodiment of the present disclosure, the protrusions 154 are spaced apart from the bumps 130 and the portion of the substrate 112 between the bumps 130 by a gap such as an air gap 156. Furthermore, the projections 152 are spaced apart from the top plane 132 of the bumps 130 by the air gap 156. The projections 152, the protrusions 154, the air gap 156, the top plane 132, the wall surfaces 134, the inclined surfaces 136, and the ridge portion 140 are configured to scatter and/or diffract the light beams generated by the light-emitting structure 116 to the outside of the light-emitting device 110. Consequently, the internal total reflection of the light beams in the light-emitting device 110 can be dramatically decreased to prevent the light beams from being adsorbed by the light-emitting structure 116, so as to improve the light extraction efficiency.

Figure 21:
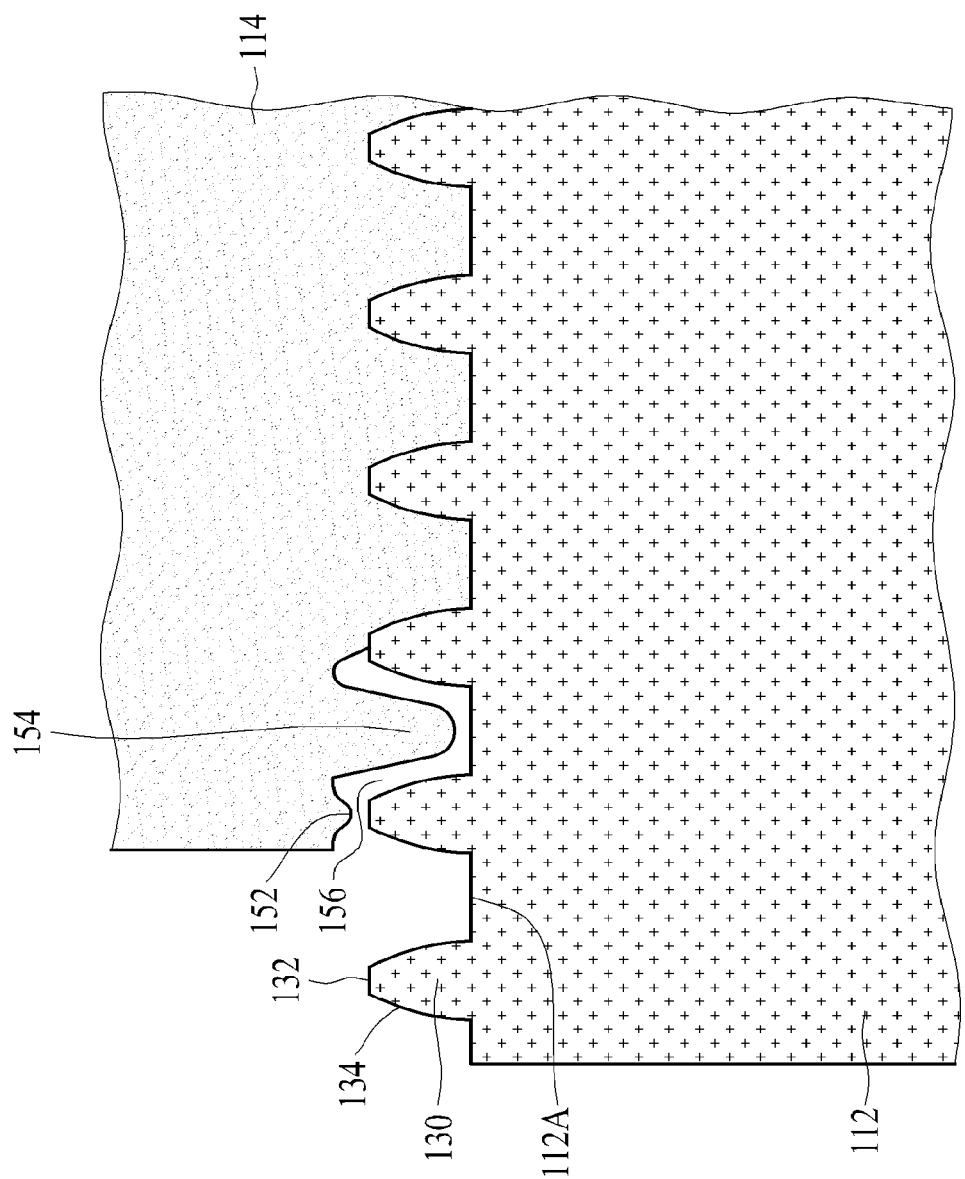
FIG. 21 is a close-up cross-sectional view along the line 5-5 in FIG. 17 according to one embodiment of the present disclosure.
Figure 22:
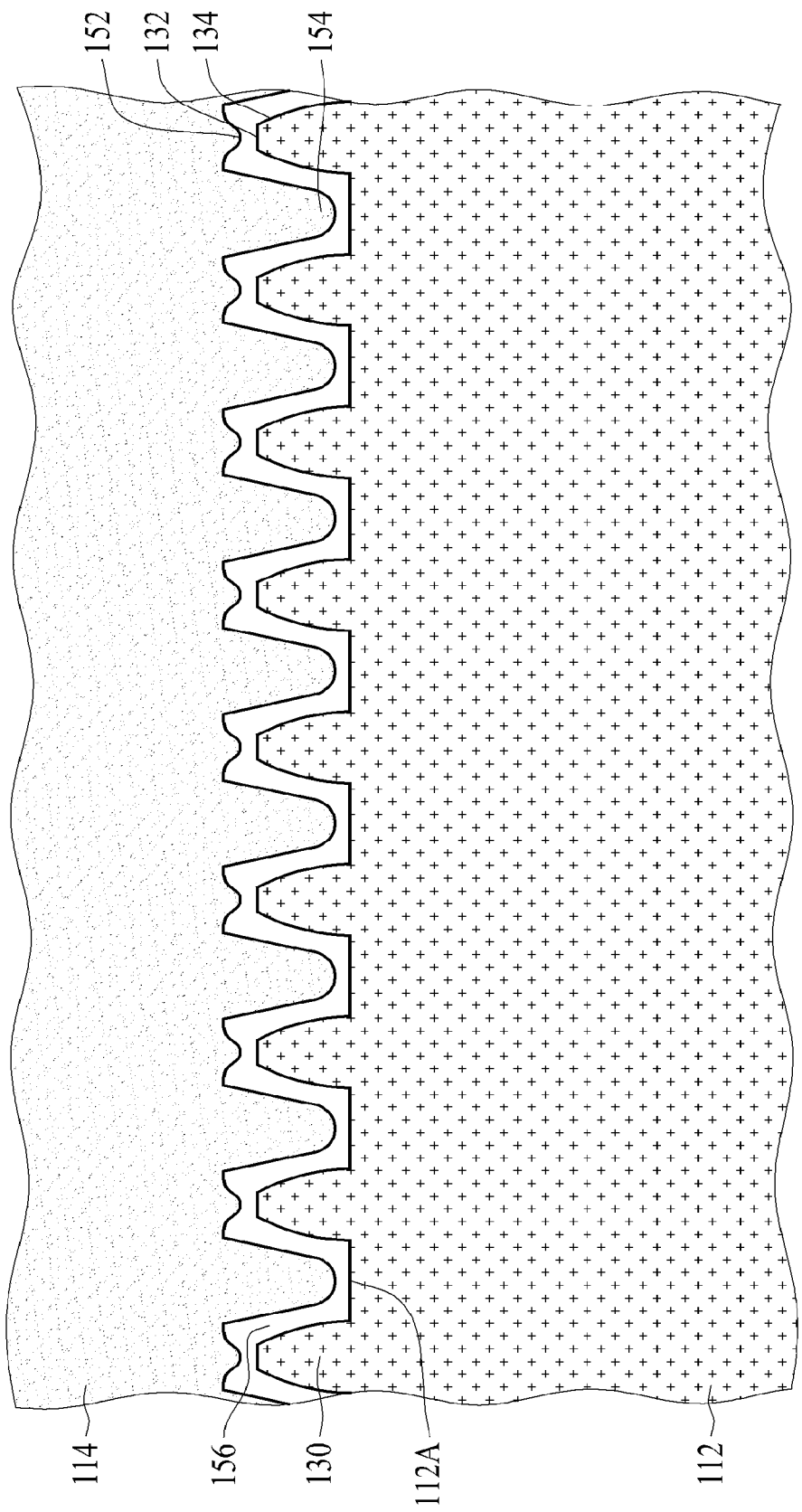
FIG. 22 is a close-up cross-sectional view along the line 6-6 in FIG. 17 according to one embodiment of the present disclosure.
Figure 23:
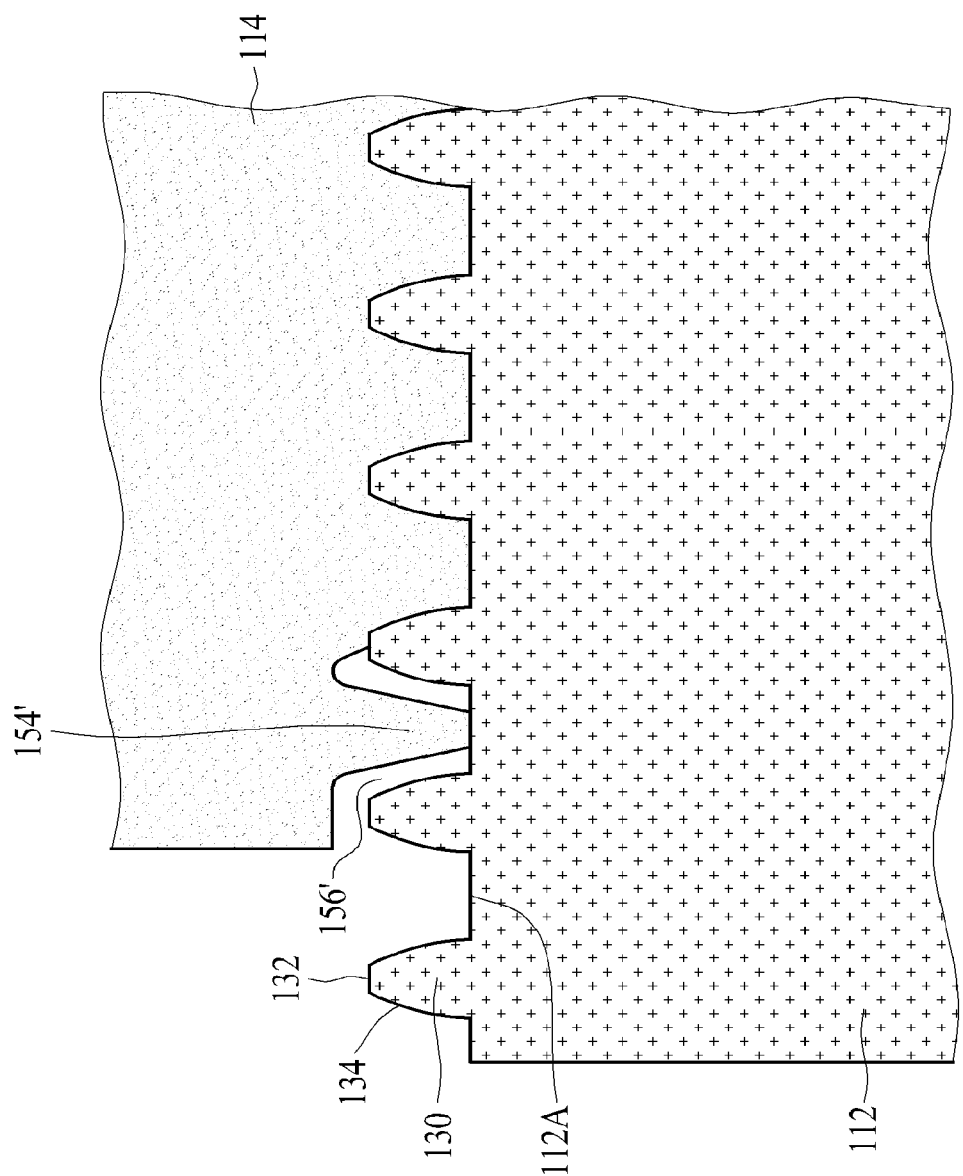
FIG. 23 is a close-up cross-sectional view along the line 5-5 in FIG. 17 according to another embodiment of the present disclosure.
Figure 24:
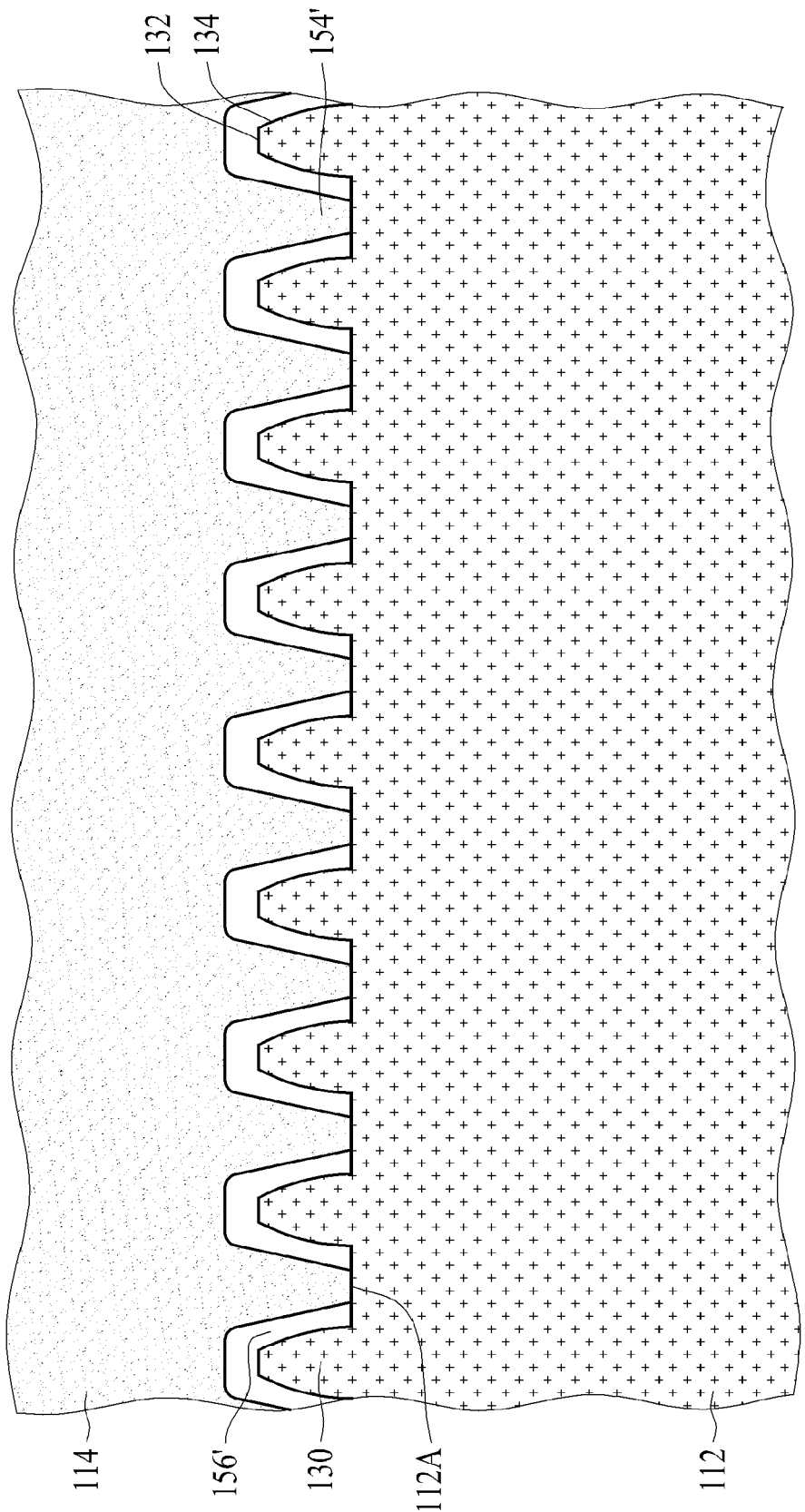
FIG. 24 is a close-up cross-sectional view along the line 6-6 in FIG. 17 according to another embodiment of the present disclosure.

FIG. 23 is a close-up cross-sectional view along the cross-sectional line 5-5 in FIG. 17, and FIG. 24 is a close-up cross-sectional view along the cross-sectional line 6-6 in FIG. 17 according to another embodiment of the present disclosure. In one embodiment of the present disclosure, the first conductive type semiconductor layer 114 includes a plurality of protrusions 154' each facing a portion of the upper surface 112A of the substrate 112 between the bumps 130, the protrusions 154' are positioned in a ring manner at a peripheral region 150 of the first conductive type semiconductor layer 114, and the width of the peripheral region 150 is between 5 and 10 microns, as shown in FIG. 17. Furthermore, the first conductive type semiconductor layer 114 may optionally include a plurality of projections (not shown in FIG. 23 or FIG. 24) each facing the top plane 132 of the bumps 130, similar to the projections 152 shown in FIG. 21.

In one embodiment of the present disclosure, the protrusions 154' contact the portion of the substrate 112 between the bumps 130, and are spaced apart from the bumps 130 by a gap such as an air gap 156'. Furthermore, the protrusions 154', the air gap 156', the top plane 132, the wall surfaces 134, the inclined surfaces 136, and the ridge portion 140 are configured to scatter and/or diffract the light beams generated by the light-emitting structure 116 to the outside of the semiconductor light-emitting device 110. Consequently, the internal total reflection of the light beams in the light-emitting device 110 can be dramatically decreased to prevent the light beams from being adsorbed by the light-emitting structure 116, so as to improve the light extraction efficiency.

The air gap 156 or 156' can be formed by performing a wet etching process after the epitaxy process of the first conductive type semiconductor layer 114. The etchant of the wet etching process may include hydrofluoric acid, nitric acid, phosphoric acid, base solution, or mixture of base solution and alcohol, which etches the first conductive type semiconductor layer 114 along the interface between the bumps 130 of the substrate 112 and the first conductive type semiconductor layer 114. The projections 152 may be removed by the wet etching process such that the first conductive type semiconductor layer 114 only has the protrusion 154 or 154' facing the substrate 112.

In one embodiment of the present disclosure, the substrate 112 includes transparent insulation material such as sapphire, silicon, or silicon carbide; the n-type semiconductor layer 114, the light-emitting structure 116 and the p-type semiconductor layer 118 may include III-V material selected from the group consisting of AlGaN, GaN, InGaN, AlGaInN, GaP, or GaAsP; the contact layer 120 includes III-V material selected from the group consisting of AlGaN, GaN, InGaN, AlGaInN, GaP, or GaAsP; the transparent conductive layer 122 includes indium oxide, tin oxide or indium tin oxide; and the light-emitting structure 116 may includes the quantum well or multi-quantum well structure sandwiched between a p-cladding layer and an n-cladding layer on the n-type semiconductor layer 114. In addition, the n-type semiconductor layer 114, the light-emitting structure 116 and the p-type semiconductor layer 118 may include II-VI material selected from the group consisting of ZnCdSe, ZnMgSe, ZnBaSe, ZnBeSe, ZnCaSe, ZnSrSe, ZnCdSSe, ZnMgSSe, ZnCdTe, ZnMgTe, ZnBaTe, ZnBeTe, ZnCaTe, ZnSrTe, ZnCdSTe and ZnMgSTe. In particular, the epitaxy machine can fabricate these layers on the substrate 112.

In one embodiment of the present disclosure, the top plane 132 is a C-plane (0,0,1) substantially parallel to the upper surface 112A of the substrate 112. The preparation of the bumps 130 may include the steps of forming a mask having a plurality of patterns covering a portion of the substrate, performing an etching process to remove a portion of the substrate not covered by the mask, removing the mask, and performing another etching process on the substrate without the shadowing of the mask to form the bumps 130 on the substrate 112. In one embodiment of the present disclosure, the etching process can be wet etching process using an etchant including phosphoric acid.

Although the present disclosure and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

The invention claimed is:

1. A semiconductor light-emitting device, comprising:
   a sapphire substrate comprising a plurality of flat surfaces and a plurality of bumps protruding from the plurality of flat surfaces, wherein each bump of the plurality of bumps is separated from an adjacent bump by one of the flat surfaces;
   a semiconductor layer having a first surface positioned on the sapphire substrate and a second surface opposite to the first surface, the first surface comprising:
      a plurality of first protrusions, each of the first protrusions contacting each of the flat surfaces of the sapphire substrate respectively; and
      a plurality of second protrusions protruding from the first surface of the semiconductor layer and extending toward the plurality of bumps of the sapphire substrate respectively, wherein each of the plurality of second protrusions is spaced apart from each of the bumps by an air gap; and
   a light-emitting structure positioned on the second surface.

2. The semiconductor light-emitting device of claim 1, wherein at least one of the plurality of first protrusions is spaced apart from at least one of the plurality of bumps.

3. The semiconductor light-emitting device of claim 2, wherein at least one of the plurality of first protrusions is spaced apart from at least one of the plurality of bumps by an air gap.

4. The semiconductor light-emitting device of claim 1, wherein at least one of the plurality of second protrusions is narrower or shorter than at least one of the plurality of first protrusions.

5. The semiconductor light-emitting device of claim 1, wherein at least one of the plurality of first protrusions is disposed in a peripheral region of the semiconductor layer.

6. The semiconductor light-emitting device of claim 1, wherein at least one of the plurality of bumps is not covered by the semiconductor layer.

7. The semiconductor light-emitting device of claim 1, wherein the plurality of bumps is arranged in a periodic configuration.

8. The semiconductor light-emitting device of claim 1, wherein the sapphire substrate has a circular region not covered by the semiconductor layer.

9. The semiconductor light-emitting device of claim 1, wherein the plurality of bumps surrounds a peripheral region of the sapphire substrate, and the plurality of first protrusions and the plurality of second protrusions surround a peripheral region of the semiconductor layer.

10. The semiconductor light-emitting device of claim 1, wherein the plurality of first protrusions and the plurality of second protrusions are formed at an edge of the semiconductor layer, but not in a center of the semiconductor layer.

11. A semiconductor light-emitting device, comprising:
    a sapphire substrate comprising a plurality of flat surfaces and a plurality of bumps, wherein each bump of the plurality of bumps is separated from an adjacent bump by one of the flat surfaces;
    a semiconductor layer having a first surface positioned on the sapphire substrate and a second surface opposite to the first surface, the first surface comprising:
       a plurality of first protrusions, each of the first protrusions contacting each of the flat surfaces of the sapphire substrate respectively; and
       a plurality of second protrusions protruding from the first surface of the semiconductor layer and extending toward the plurality of bumps of the sapphire substrate respectively, wherein multiple of the plurality of second protrusions are respectively spaced apart from multiple of the bumps by an air gap; and
    a light-emitting structure positioned on the second surface.

12. A semiconductor light-emitting device, comprising:
    a sapphire substrate comprising a plurality of flat surfaces and a plurality of bumps, wherein each bump of the plurality of bumps is separated from an adjacent bump by one of the flat surfaces;
    a semiconductor layer having a first surface positioned on the sapphire substrate and a second surface opposite to the first surface, the first surface comprising:
       a plurality of first protrusions, each of the first protrusions contacting each of the flat surfaces of the sapphire substrate respectively; and
       a plurality of second protrusions protruding from the first surface of the semiconductor layer and extending toward the plurality of bumps of the sapphire substrate respectively, wherein one of the plurality of second protrusions is spaced apart from one of the bumps by an air gap; and
    a light-emitting structure positioned on the second surface.

* * * * *